United States Patent
Ito

(10) Patent No.: US 7,189,624 B2
(45) Date of Patent: Mar. 13, 2007

(54) FABRICATION METHOD FOR A SEMICONDUCTOR DEVICE INCLUDING A SEMICONDUCTOR SUBSTRATE FORMED WITH A SHALLOW IMPURITY REGION

(75) Inventor: Takayuki Ito, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 276 days.

(21) Appl. No.: 10/868,016

(22) Filed: Jun. 16, 2004

(65) Prior Publication Data

US 2005/0023577 A1 Feb. 3, 2005

(30) Foreign Application Priority Data

Jun. 17, 2003 (JP) ............................ P2003-172239

(51) Int. Cl.
*H01L 21/336* (2006.01)

(52) U.S. Cl. ...................... 438/308; 438/795; 438/197; 438/199; 257/369; 257/408; 257/E21.634

(58) Field of Classification Search ................ 438/795, 438/308
See application file for complete search history.

(56) References Cited

U.S. PATENT DOCUMENTS

| | | | | |
|---|---|---|---|---|
| 5,399,506 A | * | 3/1995 | Tsukamoto | 438/301 |
| 5,523,262 A | * | 6/1996 | Fair et al. | 438/799 |
| 5,904,575 A | * | 5/1999 | Ishida et al. | 438/770 |
| 6,040,019 A | * | 3/2000 | Ishida et al. | 427/526 |
| 6,358,806 B1 | * | 3/2002 | Puchner | 438/308 |

FOREIGN PATENT DOCUMENTS

| | | |
|---|---|---|
| JP | 6-69149 | 3/1994 |
| JP | 6-163574 | 6/1994 |
| JP | 9-120965 | 5/1997 |
| JP | 11-74352 | 3/1999 |
| JP | 11-163309 | 6/1999 |
| JP | 2000-36597 | 2/2000 |
| JP | 2000-138177 | 5/2000 |
| JP | 2000-323713 | 11/2000 |
| JP | 2000-349039 | 12/2000 |
| JP | 2002-203806 | 7/2002 |
| JP | 2002-246329 | 8/2002 |

OTHER PUBLICATIONS

Notice of Grounds for Rejection issued by the Japanese Patent Office on Oct. 31, 2006, for Japanese Patent Application No. 2003-172239, and English-language translation thereof.

\* cited by examiner

*Primary Examiner*—Jerome Jackson
*Assistant Examiner*—Paul Budd
(74) *Attorney, Agent, or Firm*—Finnegan, Henderson, Farabow, Garrett & Dunner, L.L.P.

(57) ABSTRACT

A method of manufacturing a semiconductor device includes forming isolation regions, a gate insulator film and gate electrodes, implanting in the silicon substrate with impurity ions, annealing to recover crystallinity of the implanted silicon substrate without diffusing the impurity ions, depositing an interlayer insulator film on the isolation regions, the silicon substrate, and the gate electrodes, and heating the silicon substrate by irradiating a light having a wavelength that the light is absorbed by the silicon substrate without being absorbed by the interlayer insulator film, activating the impurity ions so as to form source and drain regions.

13 Claims, 16 Drawing Sheets

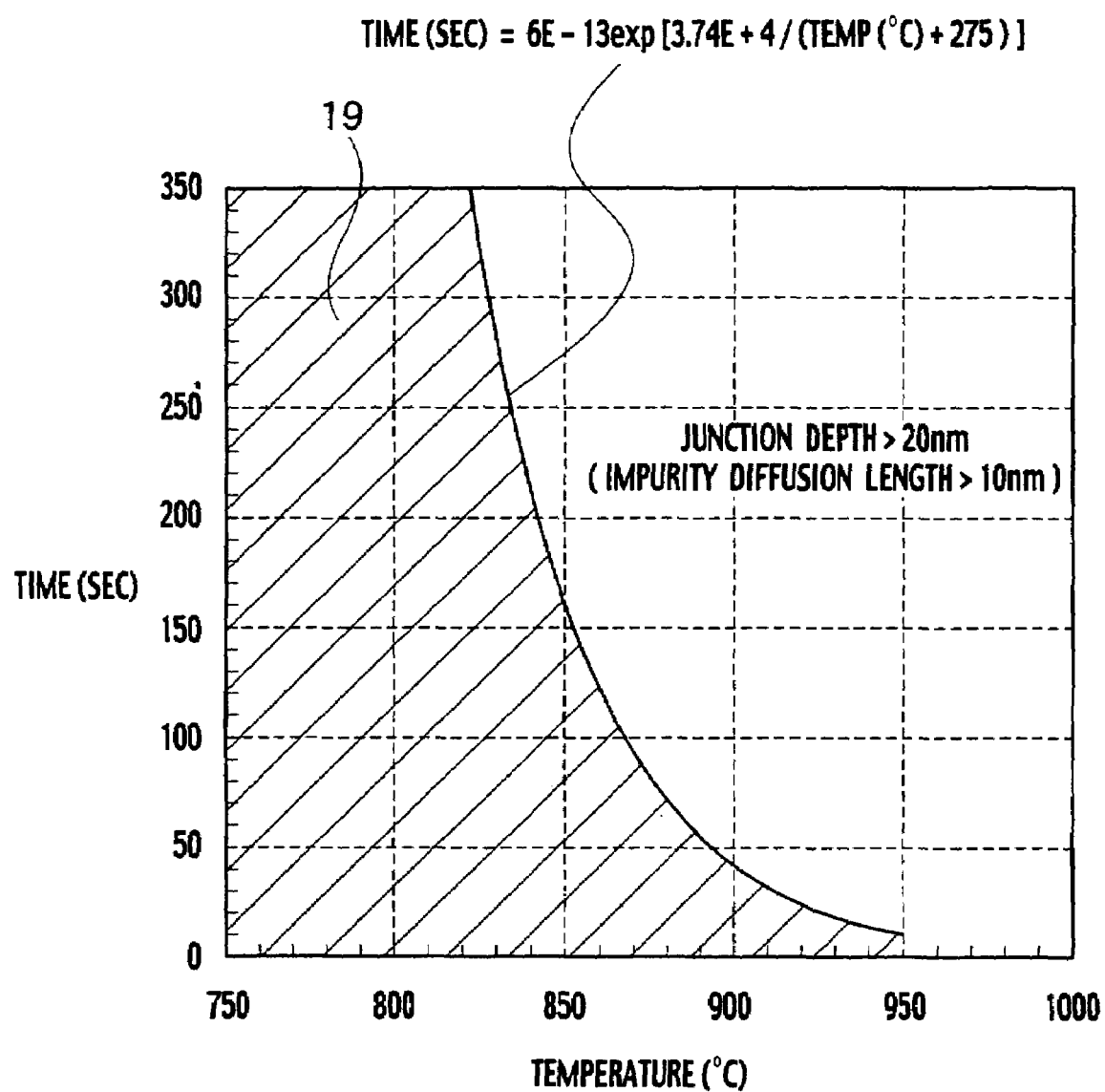

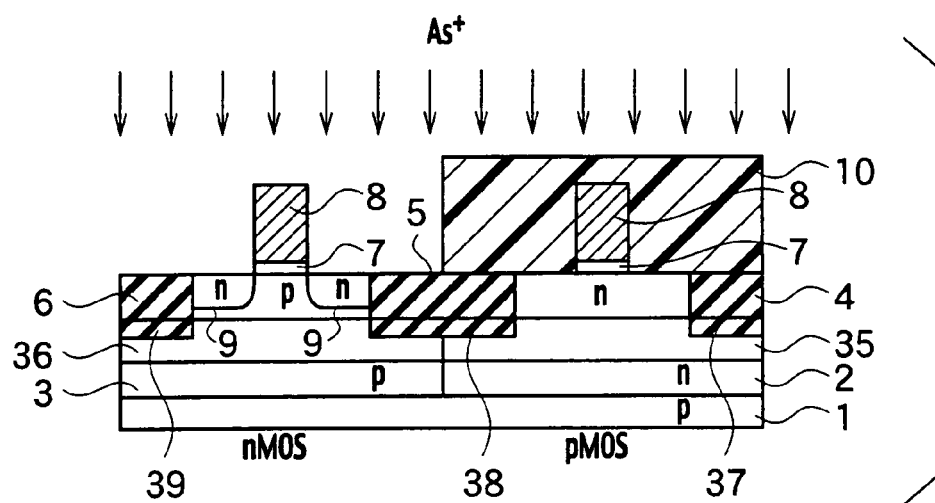
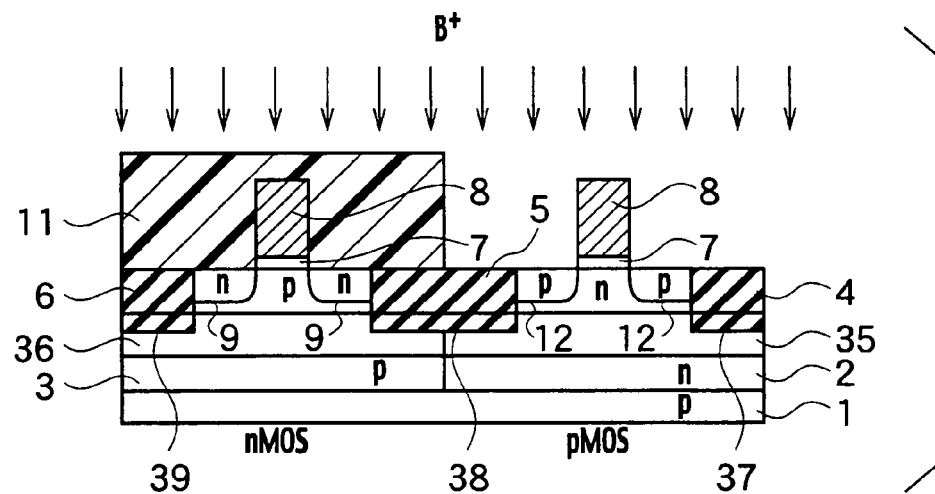
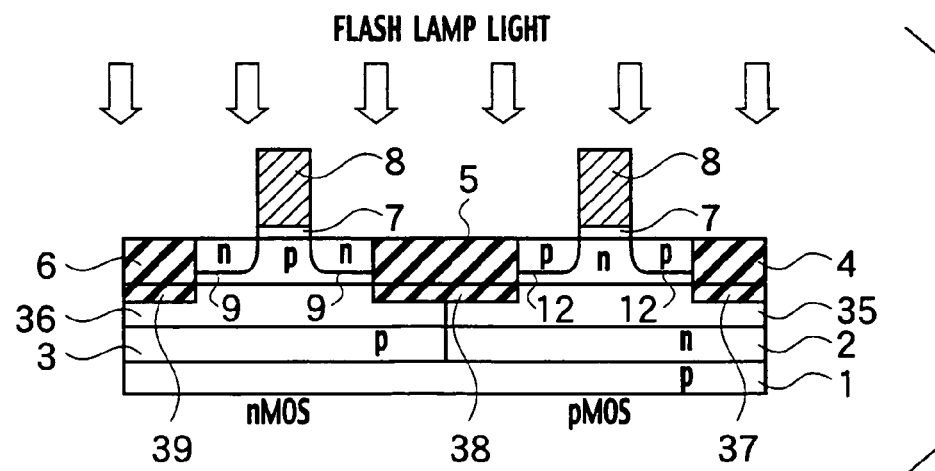

FABRICATION METHOD FOR A SEMICONDUCTOR DEVICE INCLUDING A SEMICONDUCTOR SUBSTRATE FORMED WITH A SHALLOW IMPURITY REGION

CROSS REFERENCE TO RELATED APPLICATIONS

This application is based upon and claims the benefit of priority from prior Japanese Patent Applications No. P2003-172239, filed on Jun. 17, 2003; the entire contents of which are incorporated herein by reference.

BACKGROUND OF THE INVENTION

1. Field of the Invention

The present invention relates to a fabrication method for a semiconductor device for conducting heat treatment on a semiconductor device using a high-intensity light source, and the semiconductor device subjected thereto.

2. Description of the Related Art

Improvement in performance of a large-scale integration (LSI) semiconductor device, is achieved by increasing the scale of integration. In other words, LSI performance may be improved through miniaturization of devices configuring the semiconductor device. As a result, the LSI is increased to a larger scale, and the devices are miniaturized. In addition, for device miniaturization, a shallow pn junction should be formed at a shallow location approximately 20 nm or less from the surface of the semiconductor substrate. However, formation of a shallower pn junction concurrent with the miniaturization of devices is difficult.

A shallow impurity diffused region must be formed so as to form the shallow pn junction. As a method of forming the shallow impurity diffused region, to begin with, impurity ions with low acceleration energy are implanted in the semiconductor substrate, and the semiconductor substrate is then subjected to a heat treatment. However, with ion implantation of a p-type dopant of boron (B), an n-type dopant of phosphorous (P), and arsenic (As), as impurities, since there is a large diffusion coefficient in the silicon (Si) of the semiconductor substrate, the impurities are diffused inwardly to and outwardly from the semiconductor substrate during rapid thermal annealing (RTA). The RTA is conducted by a halogen lamp. Shallow impurity diffused regions containing a concentrated impurity can not be formed in the semiconductor substrate. On the other hand, the concentrated impurity is not activated if the heat treatment temperature in the RTA processing is decreased so as to control the impurity diffusion. As such, it is difficult to form a shallow impurity diffused region with a low resistance in the semiconductor substrate in which a concentrated impurity can be activated.

Techniques are known for forming a light absorbing film on the surface of an interlayer insulator film. Since the light absorbing film formed on the surface of the interlayer insulator film generates heat, while the semiconductor substrate itself does not generate heat, it is difficult to effectively and instantaneously heat up the semiconductor substrate.

SUMMARY OF THE INVENTION

An aspect of the present invention is a method for manufacturing a semiconductor device including forming a plurality of isolation regions in a silicon substrate, forming a gate insulator film on the silicon substrate, depositing gate electrodes on the gate insulator film, implanting selectively in the silicon substrate with first impurity ions, annealing to recover crystallographic quality of the implanted silicon substrate suppressing diffusion of the first impurity ions, depositing an interlayer insulator film on the isolation regions, the silicon substrate, and the gate electrodes, and heating the silicon substrate by irradiating a light having a wavelength such that the light is absorbed by the silicon substrate without being absorbed by the interlayer insulator film, to the silicon substrate via the interlayer insulator film, activating the first impurity ions so as to form source and drain regions.

Another aspect of the present invention is a method for manufacturing a semiconductor device including forming an auxiliary layer, which is at least one of a silicon carbide layer and a silicon nitride layer, in a silicon substrate, forming a plurality of isolation regions on the silicon substrate, forming a gate insulator film on the silicon substrate, depositing a gate electrode on the gate insulator film, implanting selectively in the silicon substrate with first impurity ions, and heating the silicon substrate by irradiating a light having a wavelength such that the light is absorbed by the silicon substrate, to the silicon substrate, activating the first impurity ions so as to form source and drain regions.

Yet another aspect of the present invention is a semiconductor device including a silicon substrate, a plurality of isolation regions provided on the surface of the silicon substrate, a gate insulator film provided on the silicon substrate, a gate electrode deposited on the gate insulator film, source and drain regions provided on the surface of the silicon substrate and having a conductivity different from that of the silicon substrate, and an auxiliary layer which is one of a silicon carbide layer and a silicon nitride layer provided at a location lower than the gate insulator film.

BRIEF DESCRIPTION OF THE DRAWINGS

FIG. 2 is a graph representing an applicable range of RTA processing temperature and time using a halogen lamp, which is capable of crystallinity recovery and control of re-diffusion after ion implantation to source and drain diffusion layers employing a semiconductor device fabrication method according to the first embodiment;

FIGS. 9A through 9I are cross sections of the semiconductor device according to the second embodiment in the course of fabrication;

DETAILED DESCRIPTION OF THE INVENTION

Figure 1A:
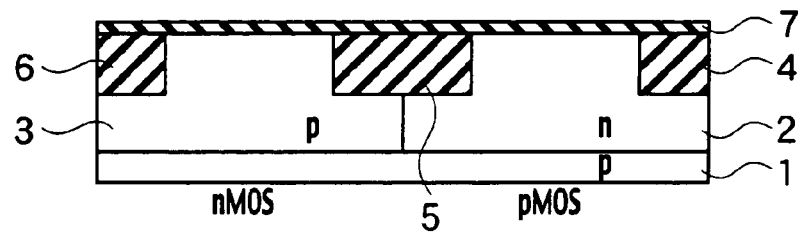
FIGS. 1A through 1H are cross sections of a semiconductor device according to a first embodiment in the course of fabrication.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(Flash Lamp Annealing)

Flash lamp annealing is provided for forming, in the semiconductor substrate, a shallow concentrated impurity diffused region with low resistance in which the impurity can be activated. More specifically, with regard to flash lamp annealing, a lamp annealing method using a xenon (Xe) flash lamp is provided for instantaneously supplying thermal energy required for impurity activation.

The xenon flash lamp includes a silica tube filled with xenon gas, and is capable of emitting high-intensity white light for a duration of, for example, several hundred µs to several hundred ms by instantaneously discharging in the tube, electric charges accumulated in a condenser or the like. The white light is absorbed into the semiconductor substrate, and the semiconductor substrate generates heat instantaneously, so that the thermal energy required for impurity activation may be obtained instantaneously. Accordingly, the concentrated impurity may be activated without varying the concentration profile of the impurity doped into the semiconductor substrate.

Since the xenon flash lamp emits light by a discharge, the entire semiconductor substrate surface, which is a wide irradiating area, is irradiated instantaneously, subjecting all of the semiconductor substrate to a heat treatment. Since the temperature of the entire semiconductor substrate surface quickly increases and decreases, it can be presumed that a large thermal stress is generated in the semiconductor substrate. Since the devices are made of different materials with irregular, minute patterns, when the high-intensity white light is irradiated onto the semiconductor substrate, there is a concern that the light refracts in the semiconductor substrate due to differing refractive indices of the different device materials the retraction causes localized convergence and formation of high temperature heat-generating points (hot spots). Due to the difference in heating efficiency, specific heat, thermal conductivity, and thermal expansion coefficient of the different device materials, the thermal stress generated between the different materials should be considered. As a result, there is a concern that the substrate will be damaged due to slips or defects in the substrate, and decrease the semiconductor device production yield.

Thus, a semiconductor device fabrication method is proposed to reduce thermal stress generated on the semiconductor substrate and to reduce generation of hot spots.

(First Embodiment)

A semiconductor device fabrication method according to a first embodiment is described, taking as an example, fabrication steps for CMOS transistors, which form an LSI semiconductor device.

To begin with, as shown in FIG. 1A, a p-well layer 3 is formed in the nMOS region of a p-type silicon (Si) substrate 1, and an n-well layer 2 is formed in the pMOS region. Isolation regions 4 and 6 are formed around the p-well layer 3 and the n-well layer 2, respectively. Furthermore, a silicon oxide film, to be a gate insulator film 7, is formed on the surface of the p-type silicon substrate 1.

Figure 1B:
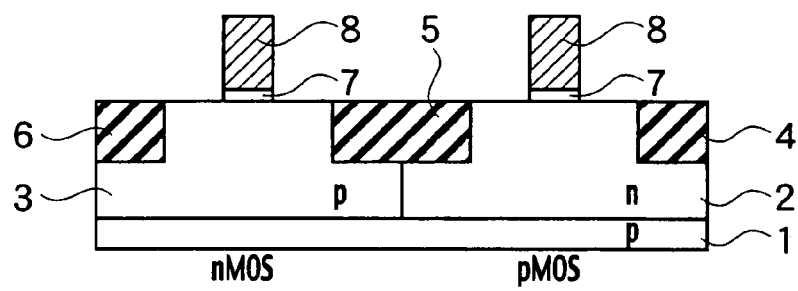

Next, as shown in FIG. 1B, a polycrystalline silicon film, which becomes gate electrodes 8, is formed on the gate insulator film 7. The polycrystalline silicon film is selectively etched through reactive ion etching (RIE), so as to form the gate electrodes 8.

Figure 1C:
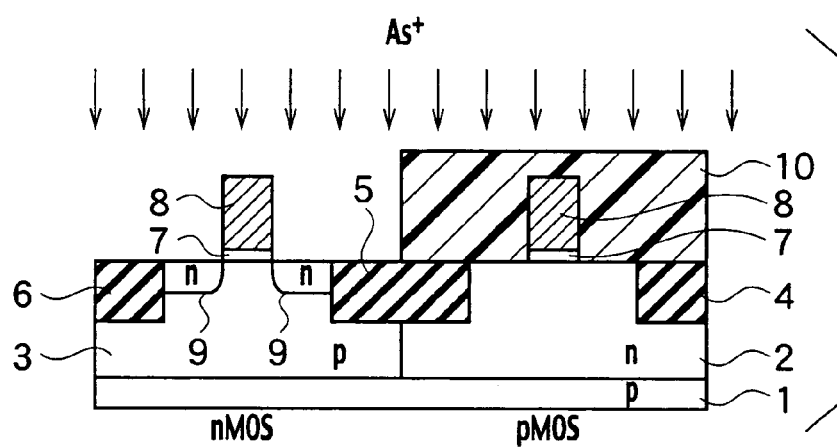

As shown in FIG. 1C, a photoresist film 10 is formed on the pMOS region. Using the photoresist film 10 and the nMOS region gate electrodes 8 as masks, a group V atom such as arsenic (As), which can be used as an n-type extension impurity, is ionized and doped into the nMOS region in the p-type silicon substrate 1. Conditions for ion implantation are an acceleration energy of 1 keV and a dose of $1 \times 10^{15}$ cm$^{-2}$. Due to the ion implantation, shallow n-type extension impurity regions 9 are formed adjacent to the gate electrodes 8 and border on the isolation regions 5 and 6. The photoresist film 10 is then removed.

Figure 1D:
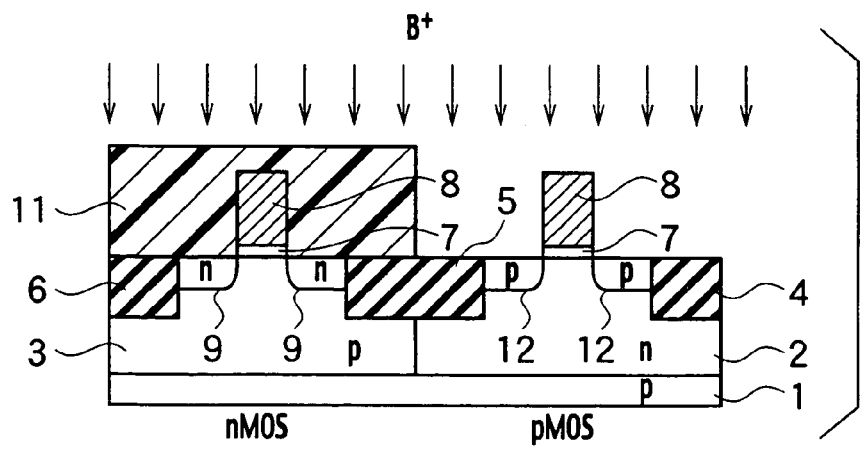

As shown in FIG. 1D, a photoresist film 11 is formed on the nMOS region. Using the photoresist film 11 and the pMOS region gate electrodes 8 as a mask, a group III atom such as boron (B), which can be used as a p-type extension impurity, is ionized and doped into the pMOS region in the p-type silicon substrate 1. Conditions for ion implantation are an acceleration energy of 0.2 keV and a dose of $1 \times 10^{15}$ cm$^{-2}$. Due to the boron ion implantation, shallow p-type extension impurity regions 12 are formed adjacent to the gate electrodes 8 and border on the isolation regions 4 and 5. The photoresist film 11 is then removed.

Next, RTA processing is conducted on the p-type silicon substrate 1 using a halogen lamp as a heat source. Conditions for RTA processing, as shown in FIG. 2, are set such that the temperature of the p-type silicon substrate 1 during RTA processing and the RTA processing heating time fall within a process window 19 indicated by diagonal lines. Accordingly, the impurity diffusion length may be controlled to 10 nm or less. Note that the boundary line of the process window 19 may be represented by Expression 1, where Time denotes the heating time (seconds) and Temp denotes the substrate temperature (° C.). More preferably, the substrate temperature should be set to no greater than 900° C., and the heating time should be set to no longer than 30 seconds. Accordingly, the impurity diffusion length may be controlled to 5 nm or less. With RTA processing, as described, the impurity is not deeply diffused into the silicon substrate 1. Crystal defects generated in the silicon substrate 1 due to ion implantation may be eliminated. Due to eliminating the crystal defects, diffusion of the impurity when the temperature of the silicon substrate 1 is increasing in a subsequent fabrication step may be controlled. However, since the substrate temperature is low, sufficiently activating the impurity is impossible.

$$\text{Time (Sec)} = 6 \times 10^{-13} \exp\{3.74 \times 10^{+4}/(\text{Temp}(°\text{C.}) + 275)\} \tag{1}$$

Figure 1E:
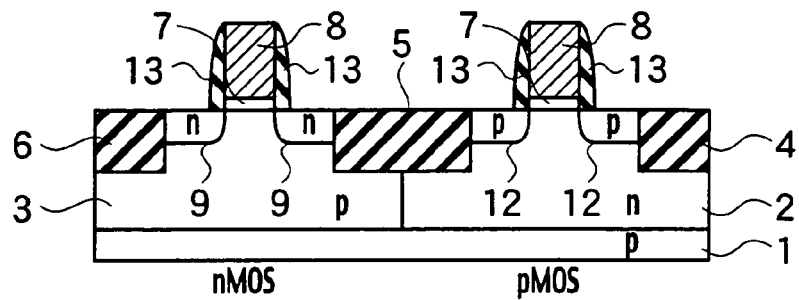

A silicon nitride (Si$_3$N$_4$) film and a silicon oxide (SiO$_2$) film are deposited, respectively, by low pressure chemical vapor deposition (LPCVD). Through RIE, the silicon nitride film and the silicon oxide film are etched, selectively leaving parts of the films on the sides of the gate electrodes 8 and the gate insulator films 7. As a result, as shown in FIG. 1E, sidewall spacers 13 are formed with a multi-level structure of the silicon nitride film and the silicon oxide film.

Figure 1F:
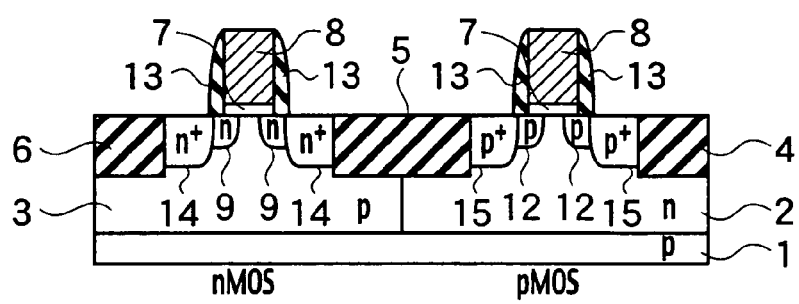

As shown in FIG. 1F, the pMOS region is masked with a photoresist film, and a group V atom such as phosphorous (P), which can be used as an n-type source/drain impurity, is ionized and doped into the nMOS region using the gate electrodes 8 and the sidewall spacers 13 as a mask. Conditions for the group V implantation are an acceleration energy of 15 keV and a dose of $3 \times 10^{15}$ cm$^{-2}$. Similarly, the nMOS region is masked with a photoresist film, and a group III atom such as boron, which can be used as a p-type source/drain impurity, is ionized and doped into the pMOS region. Conditions for ion implantation are an acceleration energy of 4 keV and a dose of $3 \times 10^{15}$ cm$^{-2}$. Through the ion implantations, deep source/drain impurity regions 14 and 15, which are separated from gate electrode 8 ends and border the isolation regions 4 and 6 and the extension impurity regions 9 and 12, respectively, are formed in the silicon substrate 1. By the ion implantations, phosphorous is doped into the nMOS region in the gate electrodes 8, and boron is doped into the pMOS regions.

Next, RTA processing is performed on the p-type silicon substrate 1 using a halogen lamp as a heat source. Conditions for RTA processing, as shown in FIG. 2, are set such that the temperature of the p-type silicon substrate 1 and the RTA processing heating time fall within the process window 19 indicated by diagonal lines. Accordingly, the impurity diffusion length may be controlled to 10 nm or less. More preferably, the substrate temperature should be set to no more than 900° C., and the heating time should be set to no longer than 30 seconds. Accordingly, the impurity diffusion length may be controlled to 5 nm or less. With the foregoing RTA processing, the impurity is not deeply diffused into the silicon substrate 1. Furthermore, crystal defects generated in the silicon substrate 1 due to ion implantation may be eliminated. Due to eliminating the crystal defects, diffusion of the impurity when the temperature of the silicon substrate 1 is increasing in a subsequent fabrication step may be controlled. However, since the substrate temperature is low, sufficiently activating the impurity doped into the source/drain impurity regions 14 and 15 is impossible.

Figure 1G:
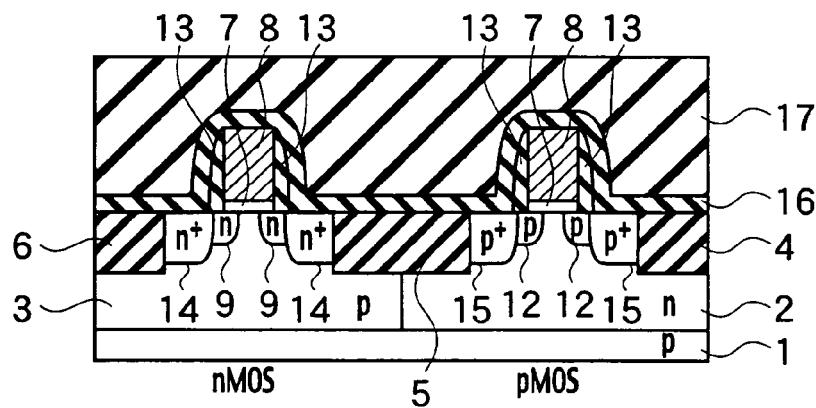

As shown in FIG. 1G, a silicon nitride film 16 is formed through LPCVD with a thickness of approximately 30 nm. Furthermore, a silicon oxide film 17 is formed through LPCVD with a thickness of approximately 500 nm. Accordingly, an interlayer insulator film made up of stacked levels of the silicon nitride film 16 and the silicon oxide film 17 may be formed.

Figure 1H:
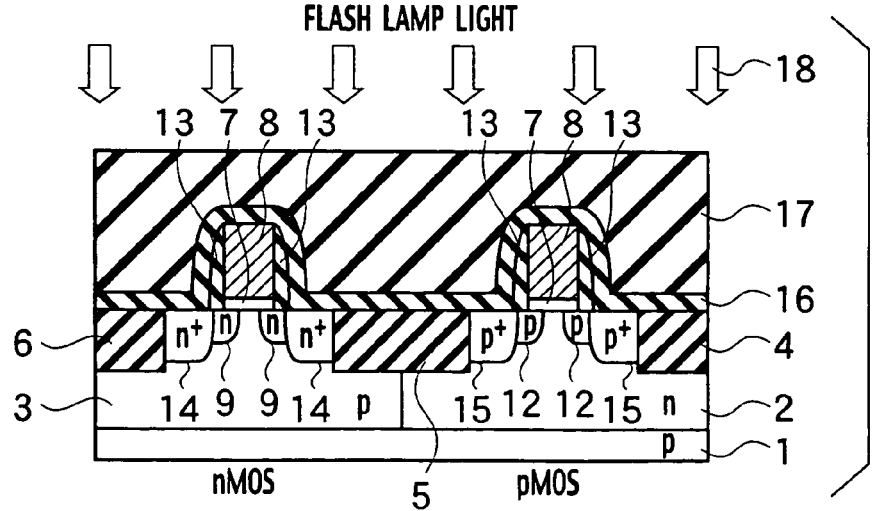

The silicon substrate 1 is heated, increasing the preheating temperature of the silicon substrate 1 and keeping the substrate at 450° C. As shown in FIG. 1H, a xenon flash lamp is irradiated above the silicon substrate 1 so as to irradiate xenon light 18 on the surface of the entire silicon substrate 1. The irradiation energy density of the xenon flash lamp light 18 is 35 J/cm$^2$, and the irradiation time is 1 ms. The irradiated xenon light 18 permeates the silicon nitride film 16, the silicon oxide film 17, and the sidewalls spacers 13, and is absorbed by the gate electrodes 8, and the extension impurity regions 9 and 12 and the source/drain impurity regions 14 and 15 in the silicon substrate 1. The gate electrodes 8 and the impurity regions 9, 12, 14 and 15 that have absorbed the xenon light 18 generate heat, thereby increasing the temperature of the gate electrodes 8 and the impurity regions 9, 12, 14 and 15. It is presumable that the temperature of the gate electrodes 8 and the impurity regions 9, 12, 14, and 15 exceeds 1000° C. Due to this temperature, the impurities doped therein are activated. Due to activation of the impurities, the resistance of the gate electrodes 8 and the impurity regions 9, 12, 14, and 15 may be reduced to a low level. Note that it is preferable that the irradiation time of the xenon light 18 is 100 ms or less. Accordingly, the temperature of the silicon substrate 1 does not excessively increase. More preferably, duration of the irradiation is 1 ms or less. This time period allows an increase in the temperature of only the gate electrodes 8 and the impurity regions 9, 12, 14, and 15. It is preferable that the irradiation energy density of the light source is 100 J/cm$^2$ or less. Accordingly, the temperature of the silicon substrate 1 also does not excessively increase. The substrate preheating temperature is preferably no greater than 600° C.

Afterwards, contact holes are formed in the interlayer insulator film on the gate electrodes 8 and the source/drain impurity regions 14 and 15. Gate interconnects are connected to the gate electrodes 8 via the contact holes. Source/drain electrodes are connected to the source/drain impurity regions 14 and 15 via the contact holes. This operation completes the semiconductor device.

With the semiconductor device fabricated using the semiconductor device fabrication method of the first embodiment, crystal defect damage does not occur in the silicon substrate 1. Since the impurities doped into the gate electrodes 8 and the impurity regions 9, 12, 14 and 15 are sufficiently activated, the sheet resistance of the gate electrodes 8 and the impurity regions 9, 12, 14 and 15 is reduced, and a sheet resistance fluctuation σ in multiple devices deployed on the silicon substrate 1 wafer is controlled to less than 1%. In this manner, device characteristics of the semiconductor device are improved.

Figure 3:
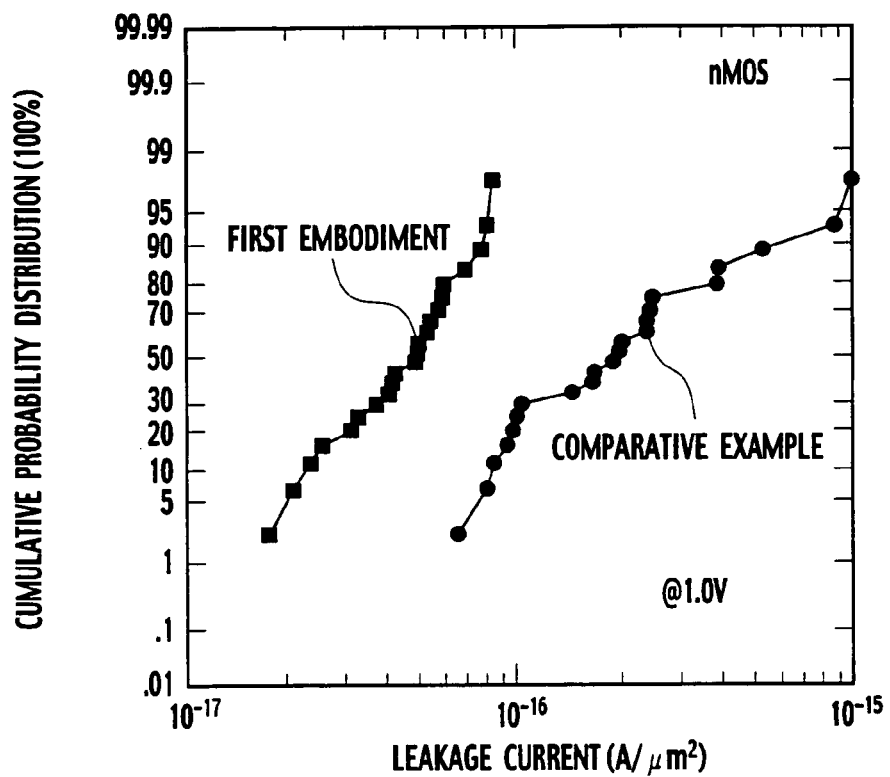
FIG. 3 is a graph representing intra-wafer cumulative probability distributions of junction leakage current of nMOSFETs in a semiconductor device according to the first embodiment.

As shown in FIG. 3, from intra-wafer cumulative probability distributions of junction leakage current flowing through pn junctions of the p-well 3 and each of the impurity regions 9 and 14 in the nMOS region of the devices deployed on the silicon substrate 1, it can be presumed that the semiconductor device of the first embodiment is formed with a pn junction having a smaller junction leakage current than a semiconductor device of a comparative example.

Note that the semiconductor device of the comparative example is fabricated by modifying a part of the semiconductor device fabrication method of the first embodiment. There are three such modifications. The first modification is that irradiation of the flash lamp light is not performed after formation of the interlayer insulator film. The second modification is that the halogen lamp RTA processing, after the extension impurity implantation of FIG. 1D, is replaced with irradiation of flash lamp light under the same conditions as in the first embodiment. The third modification is that the halogen lamp RTA processing, after the source/drain impurity implantation of FIG. 1F, is replaced with irradiation of flash lamp light under the same conditions as in the first embodiment.

With the semiconductor device of the comparative example, the sheet resistance fluctuation σ of the source/drain impurity regions 14 and 15 may be substantial in the silicon substrate 1 wafer surface. The sheet resistance fluctuation is considered to be caused by insufficient activation of the impurity doped in the source/drain impurity regions 14 and 15. Furthermore, it is understood that the junction leakage current increases since deformation through partial fusion or substrate damage, due to a crystal defect such as a slip, stacking fault or transposition, is generated.

Figure 4:
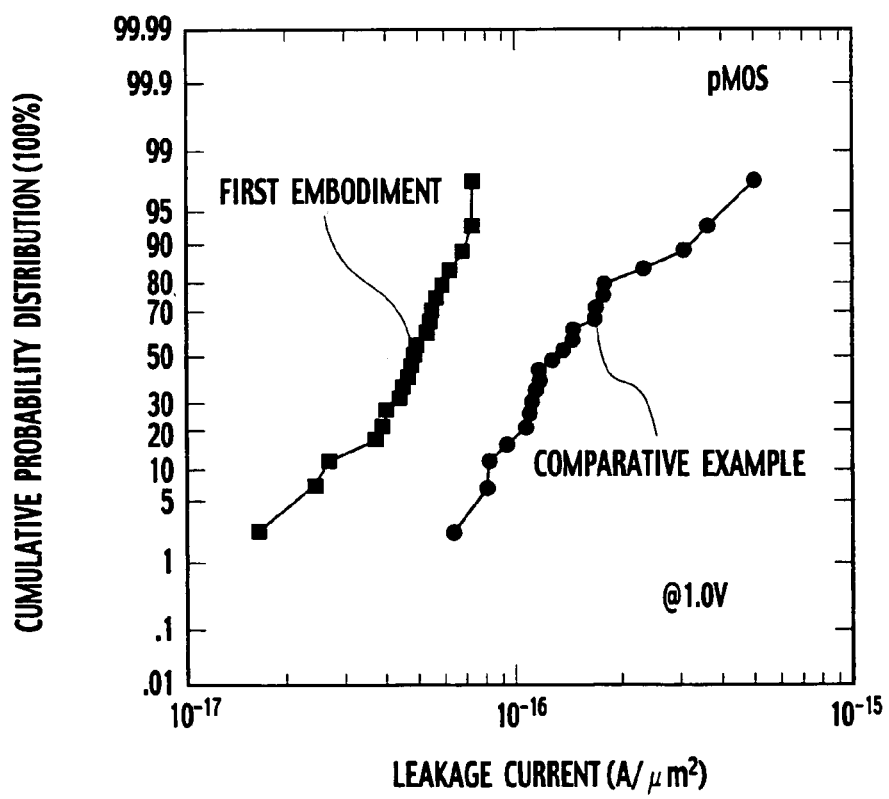
FIG. 4 is a graph representing intra-wafer cumulative probability distributions of junction leakage current of pMOSFETs in a semiconductor device according to the first embodiment.

Similarly, as shown in FIG. 4, from intra-wafer cumulative probability distributions of junction leakage current flowing through pn junctions of the n-well 2 and each of the impurity regions 12 and 15 in the pMOS region of the devices deployed on the silicon substrate 1, it can be considered that the semiconductor device of the first embodiment is formed with a pn junction having a smaller junction leakage current than the semiconductor device of the comparative example.

Figure 5:
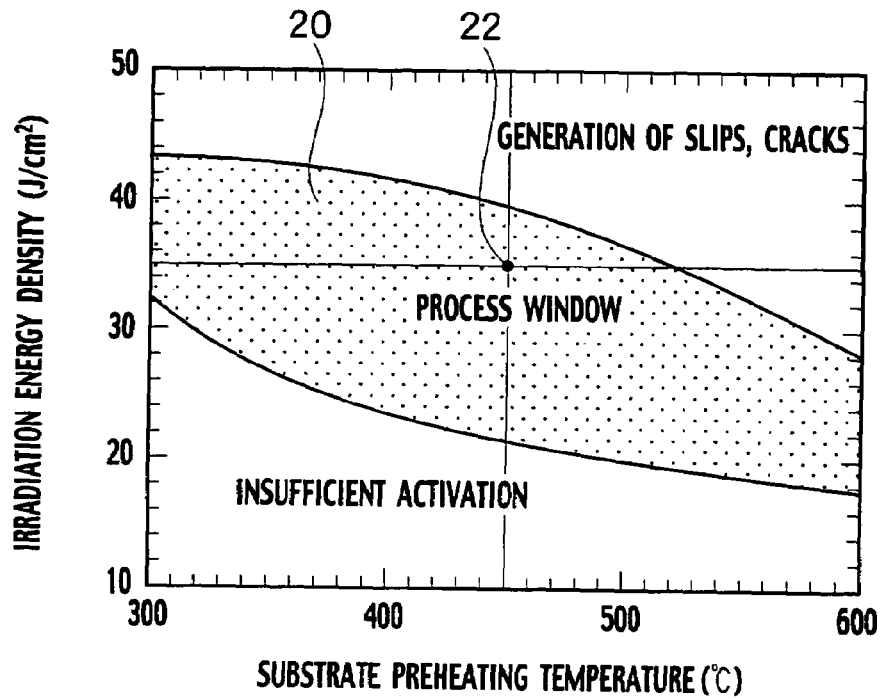
FIG. 5 is a graph representing an applicable range of substrate preheating temperature and irradiation energy density under which flash lamp annealing is carried out using a xenon flash lamp for activation after ion implantation to source and drain diffusion layers employing the semiconductor device fabrication method according to the first embodiment.

Accordingly, as shown in FIG. 5, with respect to substrate preheating temperature and irradiation energy density, a process window 20 exists, which allows formation of the impurity regions 9, 12, 14, and 15 with a low leakage current and low resistance. Slips or cracks are generated in the silicon substrate 1 when the substrate preheating temperature and irradiation energy density are too high. Sufficient activation of the impurity doped in the silicon substrate 1 is impossible when the substrate preheating temperature and irradiation energy density are too low. Furthermore, it is understood that the irradiation energy density can be reduced when the substrate preheating temperature is increased. This is because, when the substrate preheating temperature is too high, the irradiation energy density, which generates slips and the like, decreases, and the necessary irradiation energy density for sufficient activation is also reduced at the same time. Note that the processing conditions for fabrication of semiconductor devices of the first embodiment correspond to point 22 in the process window 20 shown in FIG. 5.

Figure 6:
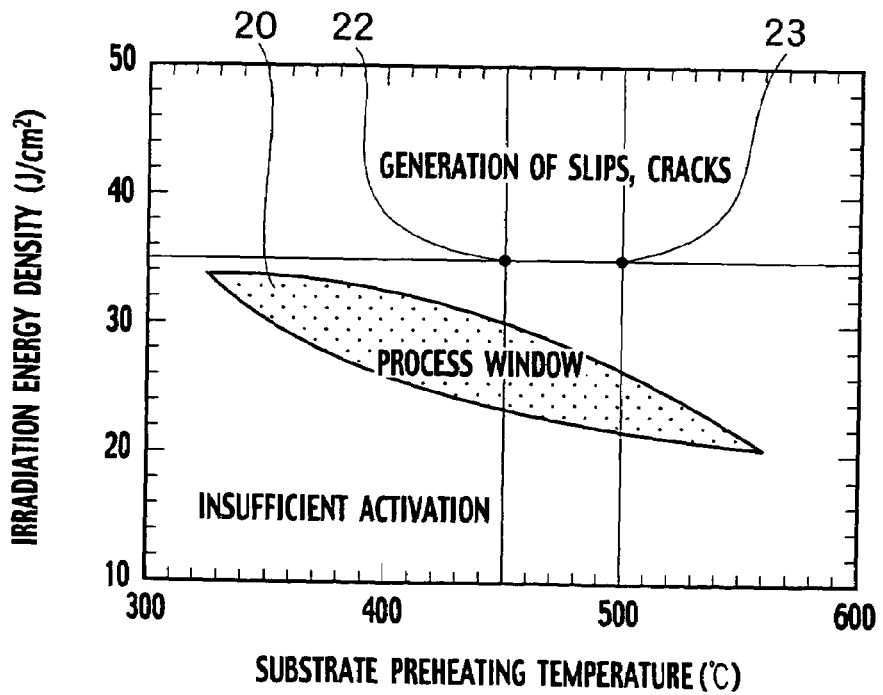
FIG. 6 is a graph representing an applicable range of substrate preheating temperature and irradiation energy density under which flash lamp annealing is carried out using a xenon flash lamp for activation after ion implantation to source and drain diffusion layers employing a semiconductor device fabrication method according to a comparative example.

On the other hand, as shown in FIG. 6, a process window 21 for fabrication of the semiconductor device of the comparative example is narrower than the process window 20 in FIG. 5 of the first embodiment. The processing conditions when the semiconductor device of the comparative example is fabricated correspond to the point 22, falling outside the process window 21.

Reasons for the process window 21 for fabrication of the semiconductor device of the comparative example being narrower than the process window 20 of the first embodiment in FIG. 5 are considered as follows.

Refractive indices n of materials configuring devices of a semiconductor device are usually distributed in a range of between 1.4 and 5.0. For example, the refractive index of silicon of the silicon substrate 1 is 4.1. The refractive index n of polysilicon (poly-Si) of the gate electrodes 8 is between 3.8 and 4.6. The refractive index n of silicon oxide ($SiO_2$) of the isolation regions 4 and 6, the gate insulator film 7, the sidewall spacers 13, and an interlayer insulator film 17 is 1.5. The refractive index n of silicon nitride ($Si_3N_4$) of the interlayer insulator film 16 and the sidewall spacers 13 is 2.0.

With the comparative example, the flash lamp light 18 is irradiated before formation of the interlayer insulator films 16 and 17. Wavelengths of the flash lamp light 18 are a continuous spectrum from visible light to infrared light. In addition, since refractive index n varies depending on the wavelength, the refractive angle changes for every wavelength. The silicon substrate 1 or the to-be-processed substrate has an absorption spectrum resulting from the band structure thereof. Seen from this absorption spectrum, the silicon substrate 1 absorbs visible light but does not absorb infrared light. As a result, the silicon substrate 1 generates localized heat when the flash lamp light 18, particularly the infrared light, is incident to the silicon substrate 1 through an atmosphere with a refractive index of 1 without passing through the interlayer insulator films 16 and 17, and converges on the silicon substrate 1 surface due to differing refractive indices between different wavelength light.

Figure 7:
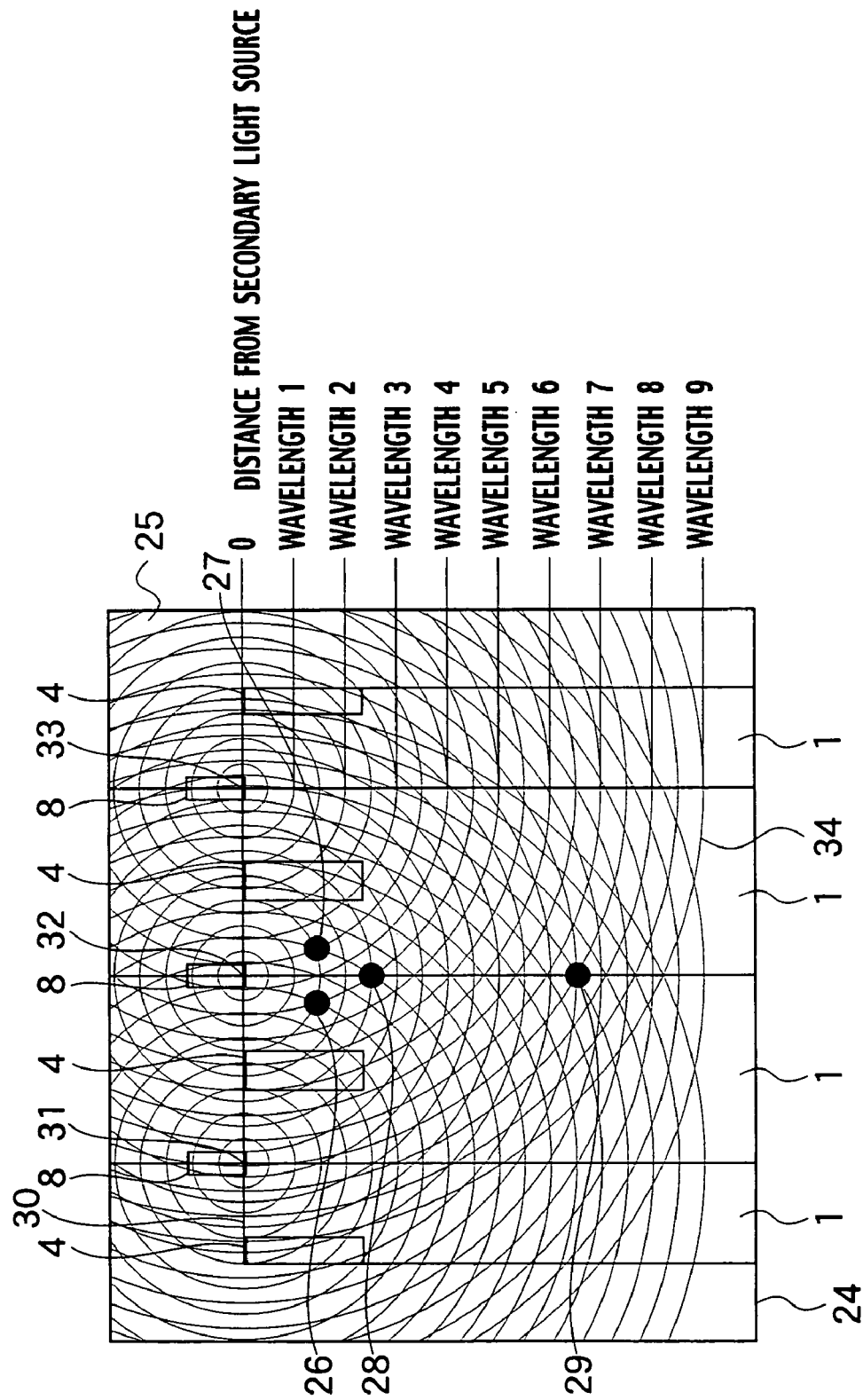
FIG. 7 is a cross section of a semiconductor device showing the locations of hot spots generated through flash lamp annealing using a xenon flash lamp for activation after ion implantation to source and drain diffusion layers employing the semiconductor device fabrication method according to the comparative example.

As shown in FIG. 7, when the flash lamp light 18 is incident to the silicon substrate 1, as described above, the same wavelength light creates interference on the surface of the silicon substrate 1 at the bottom of the gate electrodes 8. The interference then functions as multiple synchronized, second order light sources 31 to 33. In the case where the light exiting from the second order light source 32 of the flash lamp light 18 is reflected off the isolation region 4, the light source of this reflected light is assumed to be the second order light sources 31 and 33. As a result, by superimposing the three propagated waves of the same wavelength exiting from the second order light sources 31 to 33 in sync with the exiting timing, the phases of the respective three propagated waves are understood to coincide at hotspots 26 through 29. Accordingly, a maximum amplitude of the three superimposed propagated waves may be obtained at these hotspots 26 through 29. A maximum light energy may then be determined. Heat is locally generated at the hotspots 26 through 29, and is considered as the cause of slips and/or cracks. The hotspots 26 and 27 are at a distance of 1.5 wavelengths from the second order light source 32, the hotspot 28 is at a distance of 2.5 wavelengths, and the hotspot 29 is at a distance of 6.5 wavelengths. Specifically, the depth of the hotspots 26 and 27 from the silicon substrate 1 surface is approximately 150 nm if the wavelength of the second order light source 32 is equal to the peak wavelength of the xenon light 18 and is a visible light of 400 nm, which is near the critical point of the band structure of silicon.

On the other hand, with the first embodiment, the flash lamp light 18 is irradiated after formation of the interlayer insulator films 16 and 17. The flash lamp light 18 is irradiated onto the silicon substrate 1 through the atmosphere via the interlayer insulator films 16 and 17. The interlayer insulator films 16 and 17 are arranged in the recesses between the convex gate electrodes 8. The refractive index n of the oxide silicon film 17 of the interlayer insulator films is 1.5, and that of the silicon nitride film 16 is 2.0. Arranging the interlayer insulator films 16 and 17 in these recesses allows a reduction in the difference between the refractive index of the recess and the refractive index of the gate electrodes 8. The reduced difference in the refractive indices prevents generation of the second order light sources 31 and 33, preventing coherency of light from occurring. As a result, generation of the hotspots 26 through 29 may be controlled, and the intensity of the generated heat may be decreased. In addition, uniform heating of the silicon substrate 1 may be enhanced, thereby decreasing damage such as slips and/or cracks.

With the first embodiment, no light absorption film is above the silicon substrate 1 for absorbing the flash lamp light 18, thereby generating heat by irradiating the flash lamp light 18 directly onto the silicon substrate 1. Therefore, effective heating with a small amount of light energy is possible. Note that the absorption coefficient of the flash lamp light 18 for the silicon nitride film 16 and the silicon oxide film 17 of the interlayer insulating films is nearly zero. Therefore, the flash lamp light 18 can propagate energy to the silicon substrate 1 without causing a large loss in light energy. Furthermore, since a light absorption film is not utilized, a step of peeling off such a film, after light irradiation, is omitted.

Note that the silicon nitride film 16 of the interlayer insulator films may be formed through plasma CVD. Furthermore, the silicon oxide film 17 of the interlayer insulator films may be formed through plasma CVD or a coating process. Moreover, an interlayer insulator film to be formed on the silicon substrate 1 is not limited to the silicon nitride film 16 or the silicon oxide film 17. For example, the film may be a dielectric film such as an oxidized and nitrided silicon (SiON) film, a phosphor silicate glass (PSG) film, a boro-silicate glass (BSG) film, a boro-phospho silicate glass (BPSG) film, or a $SiH_4$ film. Furthermore, the film may be an organic film such as a polysilazane film, a polyallylene film, a polyallylene ether film, or a polmethylsiloxane film. The interlayer insulator films such as the silicon nitride 16 or the silicon oxide 17, and/or a dielectric film or an organic film made thereof may be porous. Making the film porous causes the flash lamp light 18 to scatter within the interlayer insulator film. By doing so, since light scatters just before the flash lamp light 18 reaches the silicon substrate 1, coherency of the light within the silicon substrate 1 is weakened, and generation of the hotspots 26 through 29 due to convergence of the light energy may be controlled. Note that the film-forming speed should be accelerated in order to form a porous film.

As another method for scattering the flash lamp light 18 within the interlayer insulator film, the microscopic irregularities of the interlayer insulator film may be formed through chemical mechanical polishing (CMP), for example. The microscopic irregularities may cause the flash lamp light 18 to scatter. The microscopic irregularities have a shorter cycle than the repeated pattern of the protrusions of the gate electrodes 8 formed on the silicon substrate 1.

An example having a substrate temperature of 900° C. or less and a heating time of 30 seconds or less for the halogen lamp RTA processing, subsequent to each ion implantation of FIGS. 1D and 1F is described with the first embodiment. However, processing conditions are not limited thereto, and the RTA processing may be omitted. By increasing the temperature of the silicon substrate 1 at the time of formation of the sidewall spacers 13 and the interlayer insulator films, the RTA processing may be combined.

With the first embodiment, before performing the heat treatment of the semiconductor device fabrication method using a high intensity light source, a film with a higher refractive index or light scattering ability than the atmosphere is formed on the silicon substrate 1 surface. The film has a microscopic, convex device pattern of the gate electrodes 8 or the like of the devices of the semiconductor device. Accordingly, heat treatment using a high intensity light source may be performed without generating damages in the silicon substrate 1.

Formation of the above film allows the coherency of the light within the silicon substrate to weaken, controls generation of hotspots due to convergence of the light energy, and reduces intensity of the converged light energy. Accordingly, the difference in refractive indices of the microscopic convex device patterns and the surroundings thereof are reduced by filling interlayer insulator films in between the microscopic convex device patterns. This provides the same effectiveness since light is scattered just before the light reaches the silicon substrate 1 by using porous interlayer insulator films and also by forming more microscopic irregularities in the interlayer insulator film surfaces than the spacing between the device patterns.

As a result of hotspot generation being controlled, the temperature of the silicon substrate is uniformly increased, and fluctuation in electrical characteristics of the devices of the semiconductor device is controlled without damaging the silicon substrate 1. Furthermore, a high-performance MOS transistor may be fabricated since miniaturization of the devices in the semiconductor device is easier.

According to the first embodiment, a semiconductor device fabrication method capable of forming a shallow pn junction without generating slips and/or defects in the semiconductor substrate may be provided.

(Second Embodiment)

A semiconductor device according to a second embodiment is described taking CMOS transistors, which form an LSI semiconductor device, as an example.

Figure 8:
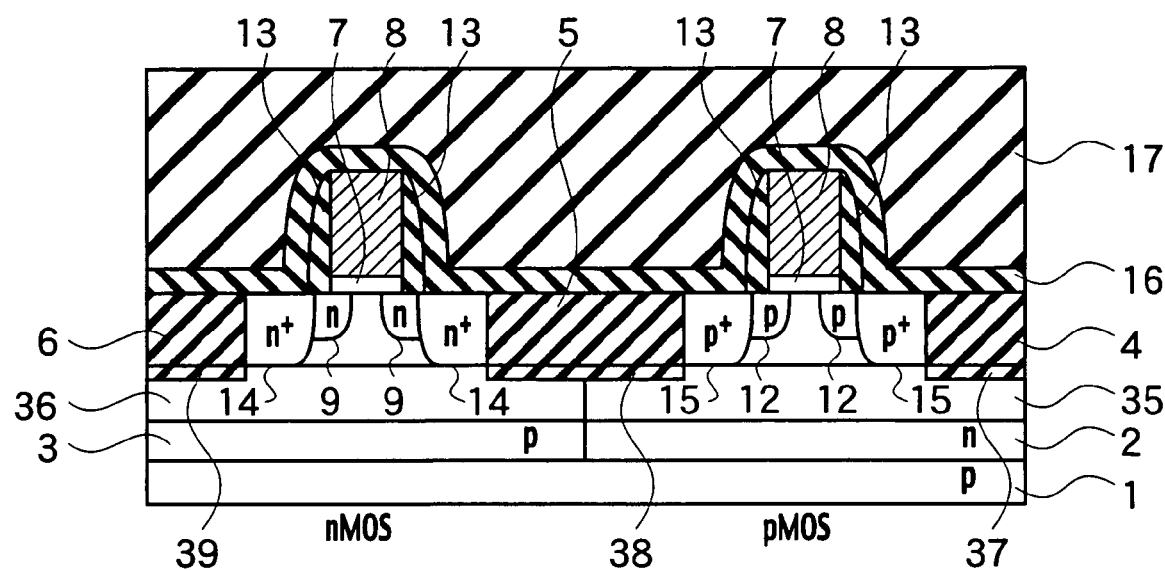
FIG. 8 is a cross section of a semiconductor device according to a second embodiment.

The semiconductor device according to the second embodiment, as shown in FIG. 8, includes a silicon substrate 1, isolation regions 4 through 6 and 37 through 39, gate insulator films 7, gate electrodes 8, source/drain impurity regions 14 and 15, extension impurity regions 9 and 12, and auxiliary layers 35 and 36 that are silicon carbide layers or silicon nitride layers.

The silicon substrate 1 includes multiple device regions in the nMOS region and the pMOS region. The p-well 3 is deployed on the silicon substrate 1 in the nMOS region. The n-well 2 is deployed on the silicon substrate 1 in the pMOS region.

The isolation regions 4 through 6 and 37 through 39 are provided on the surface of the silicon substrate 1, isolating the device regions of the nMOS region and the PMOS region. The isolation regions 37 through 39 contain a covalent compound of carbon or nitride and silicon.

The gate insulator films 7 are provided on the silicon substrate 1 in the device regions of the nMOS region and the pMOS region. The gate electrodes 8 are provided on the gate insulator films 7.

The source/drain impurity regions 14 and 15 are provided in the device regions of the nMOS region and the PMOS region including the surface of the silicon substrate 1. The source/drain impurity regions 14 have an n-type conductivity, differing from the conductivity of the p-well in the device region of the nMOS region. The source/drain impurity regions 15 have an n-type conductivity, differing from the conductivity of the n-well in the device region of the pMOS region.

The extension impurity regions 9 and 12 are provided in the device regions including the surface of the silicon substrate 1, lower than the gate electrodes 8, and border the source/drain impurity regions 14 and 15, respectively. The extension impurity regions 9 have an n-type conductivity, which is the same conductivity as that of the source/drain impurity regions 14. The extension impurity regions 12 have a p-type conductivity, which is the same as the source/drain impurity regions 15.

Silicon carbide layers or silicon nitride layers 35 and 36 are located lower than the gate insulator films 7, as well as lower than the source/drain impurity regions 14 and 15, respectively. Furthermore, the silicon carbide layers or silicon nitride layers 35 and 36 are provided beneath or lower than the isolation regions 4 through 6 and 37 through 39.

With the semiconductor device of the second embodiment, the silicon carbide layers or silicon nitride layers 35 and 36 are capable of enduring stress. Furthermore, not only the device regions in the silicon substrate 1, but the silicon carbide layers 35 and 36 and the isolation regions 37 through 39, which include a covalent compound of carbon and silicon, also generate heat from light energy, thereby heating the silicon substrate 1 uniformly.

A semiconductor device fabrication method according to the second embodiment is described taking as an example, fabrication steps of CMOS transistors, which form an LSI semiconductor device.

Figure 9A:
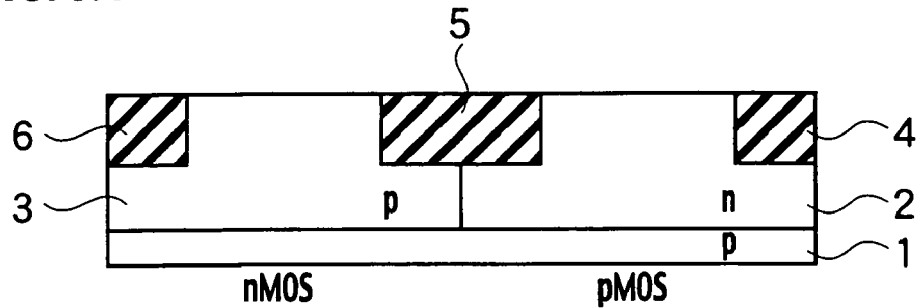

To begin with, as shown in FIG. 9A, the p-well layer 3 is formed in the nMOS region of the p-type silicon (Si) substrate 1, and the n-well layer 2 is formed in the pMOS region. The isolation regions 4 and 6 are formed around the p-well layer 3 and the n-well layer 2, respectively.

Figure 9B:
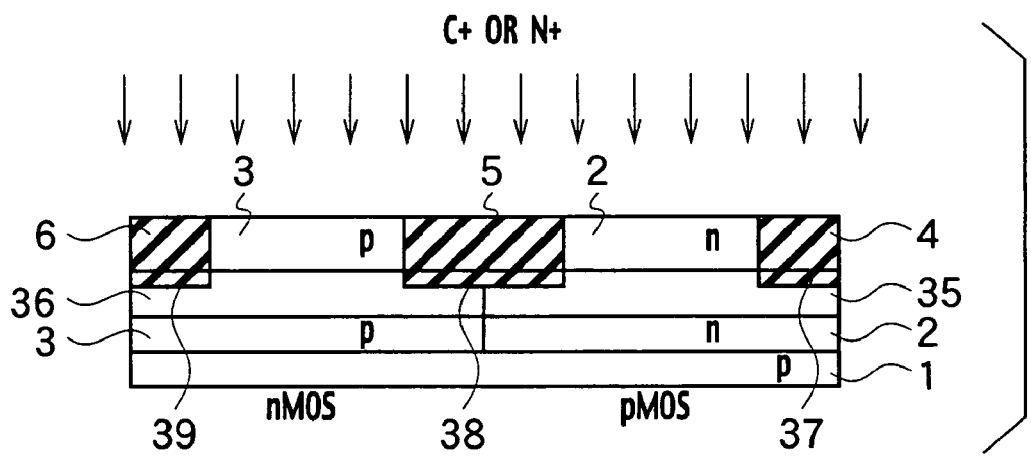

Next, as shown in FIG. 9B, auxiliary atoms of carbon or nitrogen are ionized, and implanted in the silicon substrate 1 with an acceleration energy of 100 keV and a dose of $1 \times 10^{15}$ cm$^{-2}$. The silicon substrate 1 is heated for one hour at a substrate temperature of 1000° C. Through the heat treatment, the auxiliary layers 35 and 36, which are silicon carbide layers or silicon nitride layers, are formed in the silicon substrate 1. The isolation regions 37 through 39, which include a covalent compound (Si—C) of a silicon atom and a carbon atom or a covalent compound (Si—N) of a silicon atom and a nitrogen atom, is formed beneath the isolation regions 4 through 6. Note that the depth from the silicon substrate 1 surface to which carbon or nitrogen is doped is preferably 100 nm or more. Therefore, device characteristics do not degrade. The to-be-doped carbon or nitrogen is doped to a concentration of $1 \times 10^{19}$ to $1 \times 10^{22}$ cm$^{-3}$. Therefore, the refractive index may be changed without generating crystal defects in the silicon substrate 1.

Figure 9C:
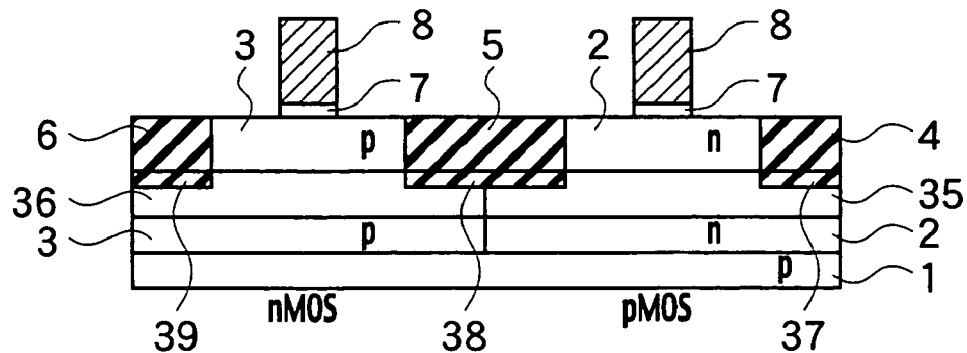

Next, as shown in FIG. 9C, the gate insulator films 7 and the gate electrodes 8 are formed. Formation of the gate insulator films 7 and the gate electrodes 8 may be implemented in the same way as with the semiconductor device fabrication method of the first embodiment in FIG. 1B.

As shown in FIG. 9D, shallow n-type extension impurity regions 9 are formed. Formation of the n-type extension impurity regions 9 may be implemented in the same way as with the semiconductor device fabrication method of the first embodiment in FIG. 1C.

As shown in FIG. 9E, shallow p-type extension impurity regions 12 are formed. Formation of the p-type extension impurity regions 12 may be implemented in the same way as with the semiconductor device fabrication method of the first embodiment in FIG. 1D.

The silicon substrate 1 is heated, increasing the preheating temperature of the silicon substrate 1 and keeping the temperature at 450° C. As shown in FIG. 9F, the xenon light 18 is irradiated on the silicon substrate 1 surface by the xenon flash lamp. As irradiation conditions, the irradiation time is 1 ms and the irradiation energy density is 35 J/cm$^2$, for example. Through this irradiation, the ion-implanted extension impurity is activated, and the crystal defects in the extension impurity regions 9 and 12 are eliminated. The resistance of the shallow extension impurity regions 9 and 12 bordering the gate electrodes 8 can be reduced to a low level. Note that the irradiation may be replaced with RTA processing using a halogen lamp. Conditions for the RTA processing are the same as for the RTA processing using a halogen lamp of FIG. 1D in the semiconductor device fabrication method of the first embodiment. With the RTA processing, the crystal defects in the extension impurity regions 9 and 12 are eliminated without the impurity being diffused deep into the silicon substrate 1. However, there is a case where the extension impurity is not sufficiently activated.

Figure 9G:
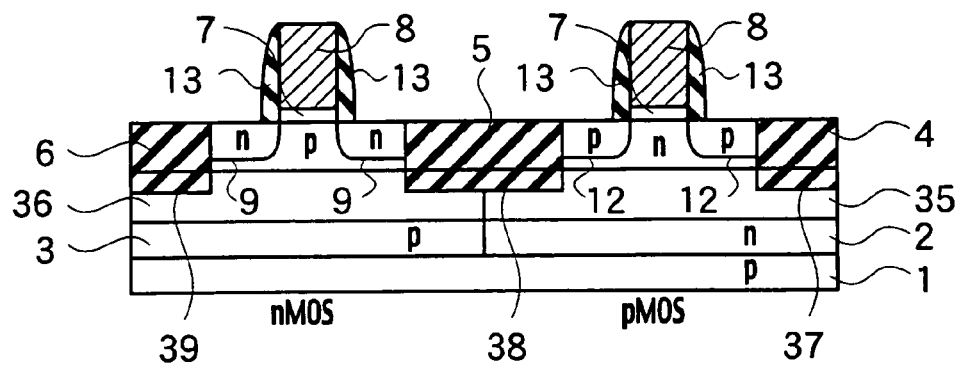

As shown in FIG. 9G, the sidewall spacers 13 are formed. Formation of the sidewall spacers 13 may be implemented in the same way as with the semiconductor device fabrication method of the first embodiment in FIG. 1E.

Figure 9H:
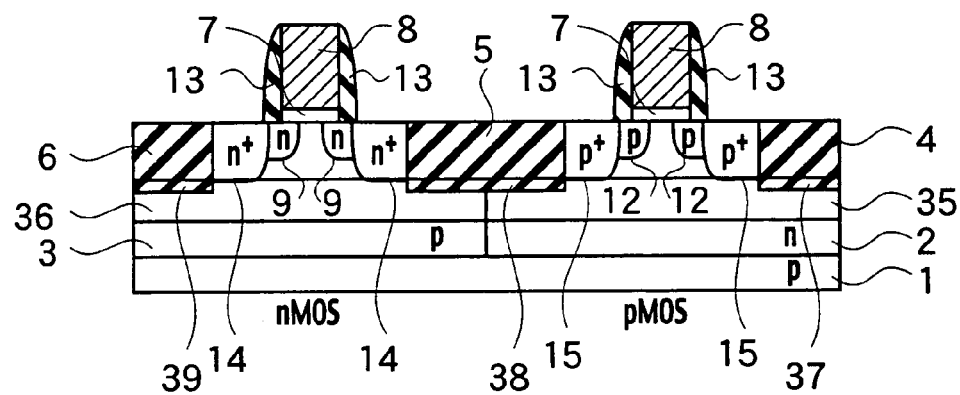

As shown in FIG. 9H, the source/drain impurity regions 14 and 15 are formed. Phosphorous is doped into the nMOS region in the gate electrodes 8, and boron is doped into the pMOS regions. Formation of the source/drain impurity regions 14 and 15 and ion implantation may be implemented in the same way as with the semiconductor device fabrication method of the first embodiment in FIG. 1F.

Figure 9I:
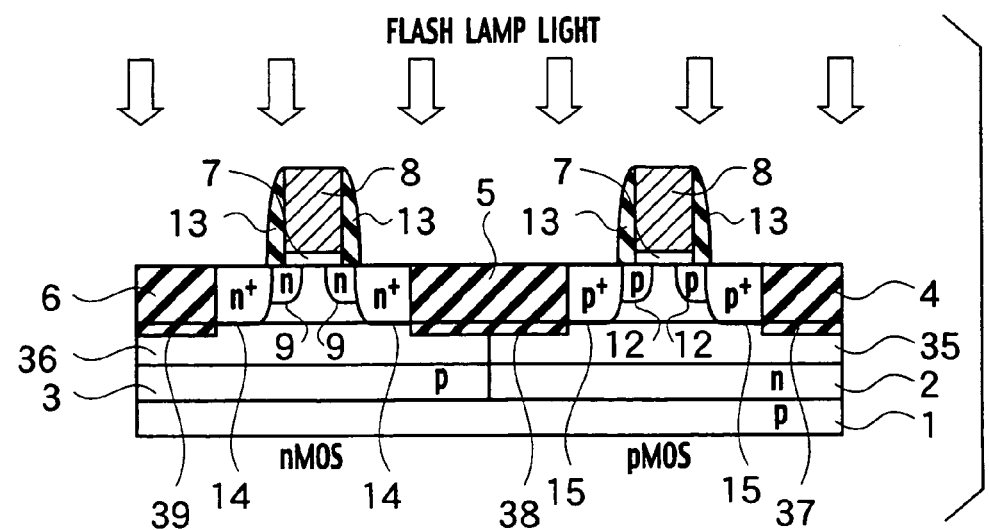

The silicon substrate 1 is heated, increasing the preheating temperature of the silicon substrate 1 and keeping the temperature at 450° C. As shown in FIG. 9I, the xenon light 18 is irradiated on the surface of the silicon substrate 1 by the xenon flash lamp. As irradiation conditions, the irradiation time is 1 ms and the irradiation energy density is 35 J/cm$^2$, for example. Through this irradiation, the ion-implanted, source/drain impurity and the impurity doped in the gate electrodes 8 are activated, as well as the crystal defects in the source/drain impurity regions 14 and 15 are eliminated. The resistance of deep extension impurity regions 14 and 15 bordering the gate electrodes 8 and of the gate electrodes 8 may be reduced to a low level. Note that it is preferable that the light emitting time of the xenon flash lamp light 18 is 100 ms or less. Accordingly, the source/drain impurity regions 14 and 15 and all of the gate electrodes may generate heat. More preferably duration of the irradiation is set to 1 ms or less. As a result, the source/drain impurity regions 14 and 15 may generate localized heat. It is preferable that the irradiation energy density of the xenon light 18 is 100 J/cm$^2$ or less. As a result, the source/drain impurity regions 14 and 15 may generate localized heat. It is preferable that the substrate preheating temperature is 600° C. or less. As a result, re-diffusion of the impurity at the time of the preheating may be controlled.

Finally, as shown in FIG. 8, a stacked interlayer insulator film of the silicon nitride film 16 and the silicon oxide film 17 is formed. Formation of the silicon nitride film 16 and the silicon oxide film 17 may be implemented in the same way as with the semiconductor device fabrication method of the first embodiment in FIG. 1G. Note that a silicon oxide film may be formed as the interlayer insulator film across the entirety through atmospheric pressure CVD at a film formation temperature of 400° C. Subsequently, contact holes are formed in the interlayer insulator film on the gate electrodes 8 and the source/drain impurity regions 14 and 15. Gate interconnects are connected to the gate electrodes 8 via the contact holes. Source/drain electrodes are connected to the source/drain impurity regions 14 and 15 via the contact holes.

With the semiconductor device of the second embodiment, damage such as a crystal defect is not created in the silicon substrate 1. Since the impurities doped in the gate electrodes 8 and the impurity regions 9, 12, 14 and 15 are sufficiently activated, the sheet resistance of the gate electrodes 8 and the impurity regions 9, 12, 14 and 15 is reduced, and a sheet resistance fluctuation σ in multiple devices deployed on the silicon substrate 1 wafer may be controlled to less than 1%. From the intra-wafer cumulative probability distribution of junction leakage current flowing through pn junctions of the p-well 3 and the impurity regions 9 and 14 in the nMOS regions of the multiple devices in the silicon substrate 1, each of the semiconductor devices of the second embodiment is formed with a pn junction and a small junction leakage current. Thus, device characteristics of the semiconductor device are improved.

Figure 10:
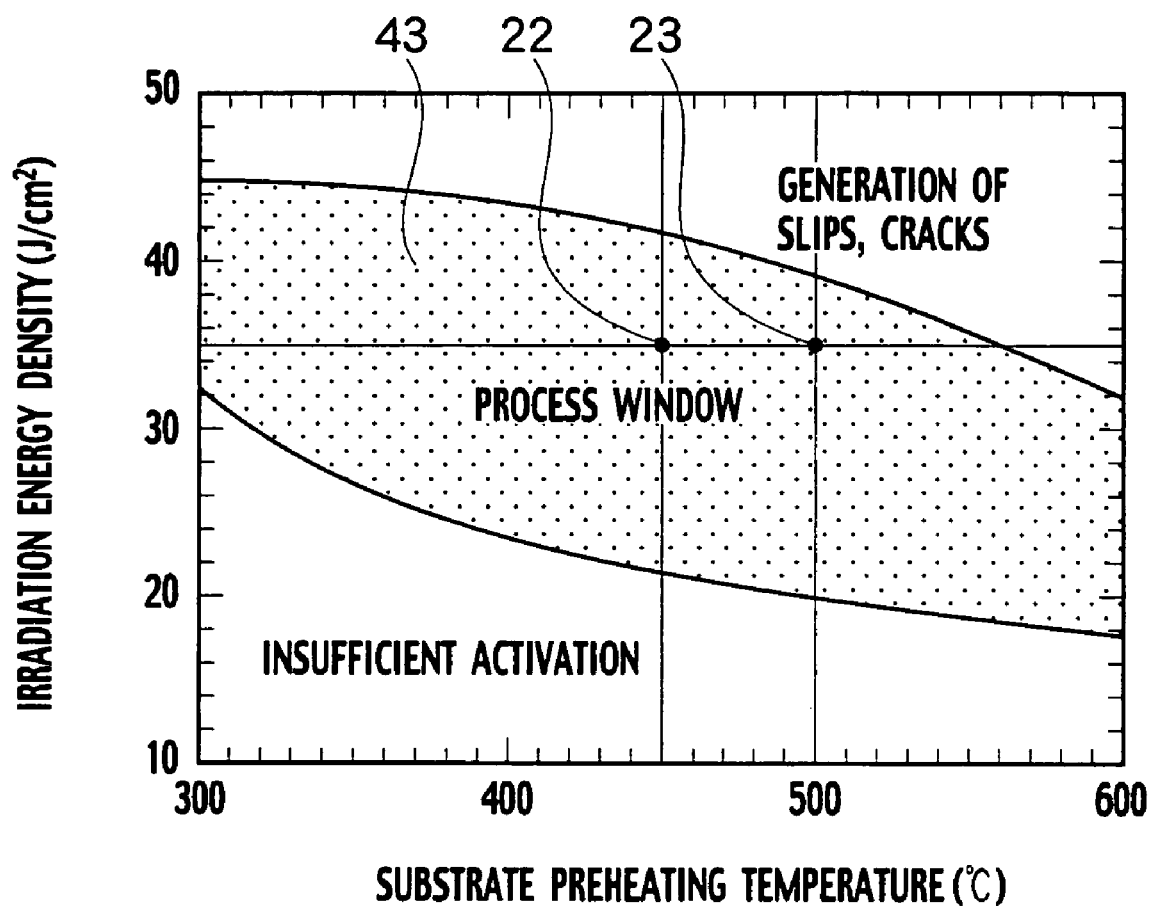
FIG. 10 is a graph representing an applicable range of substrate preheating temperature and irradiation energy density under which flash lamp annealing is carried out using a xenon flash lamp for activation after ion implantation to source and drain diffusion layers employing a semiconductor device fabrication method according to the second embodiment.

Furthermore, as shown in FIG. 10, a process window 43 of substrate preheating temperature and irradiation energy density is created which allows formation of the impurity regions 9, 12, 14, and 15 with a low leakage current and low resistance. Slips or cracks generate in the silicon substrate 1 when the substrate preheating temperature and irradiation energy density are too high. Sufficient activation of the impurity doped in the silicon substrate 1 is impossible when the substrate preheating temperature and irradiation energy density are too low. Furthermore, it is understood that the irradiation energy density can be reduced when the substrate preheating temperature is increased. This has the same tendency as with the process window 20 in FIG. 5 of the first embodiment. Furthermore, compared to the process window 20 in FIG. 5 of the first embodiment, the process window 43 extends along the irradiation energy density axis. Note that the processing conditions for fabrication of semiconductor devices of the second embodiment correspond to point 22 in the process window 43 shown in FIG. 10.

The reasons for the process window 43 of the second embodiment being enlarged are as follows.

The refractive indices n of the materials configuring devices in a semiconductor device are usually distributed in a range between 1.4 and 5.0. When the flash lamp light 18 is irradiated on the devices, since the wavelengths of the light 18 are a continuous spectrum from visible light to infrared light, and the refractive indices n vary depending on the wavelength, and the refractive angle differs for every wavelength. Furthermore, the silicon substrate 1 or the to-be-processed substrate has an absorption spectrum resulting from the band structure thereof. It can be understood from the absorption spectrum that the silicon substrate 1 absorbs visible light but does not absorb infrared light. As a result, when the light 18 is incident to the silicon substrate 1 or the isolation regions 4 through 6 through an atmosphere with a refractive index of 1, particularly the infrared light of the light 18 converges on the surface of the silicon substrate 1 or the isolation regions 4 through 6 due to the lens effect or differing refractive indices between different wavelength light. Thus, the silicon substrate 1 generates localized heat due to the lens effect.

Figure 11:
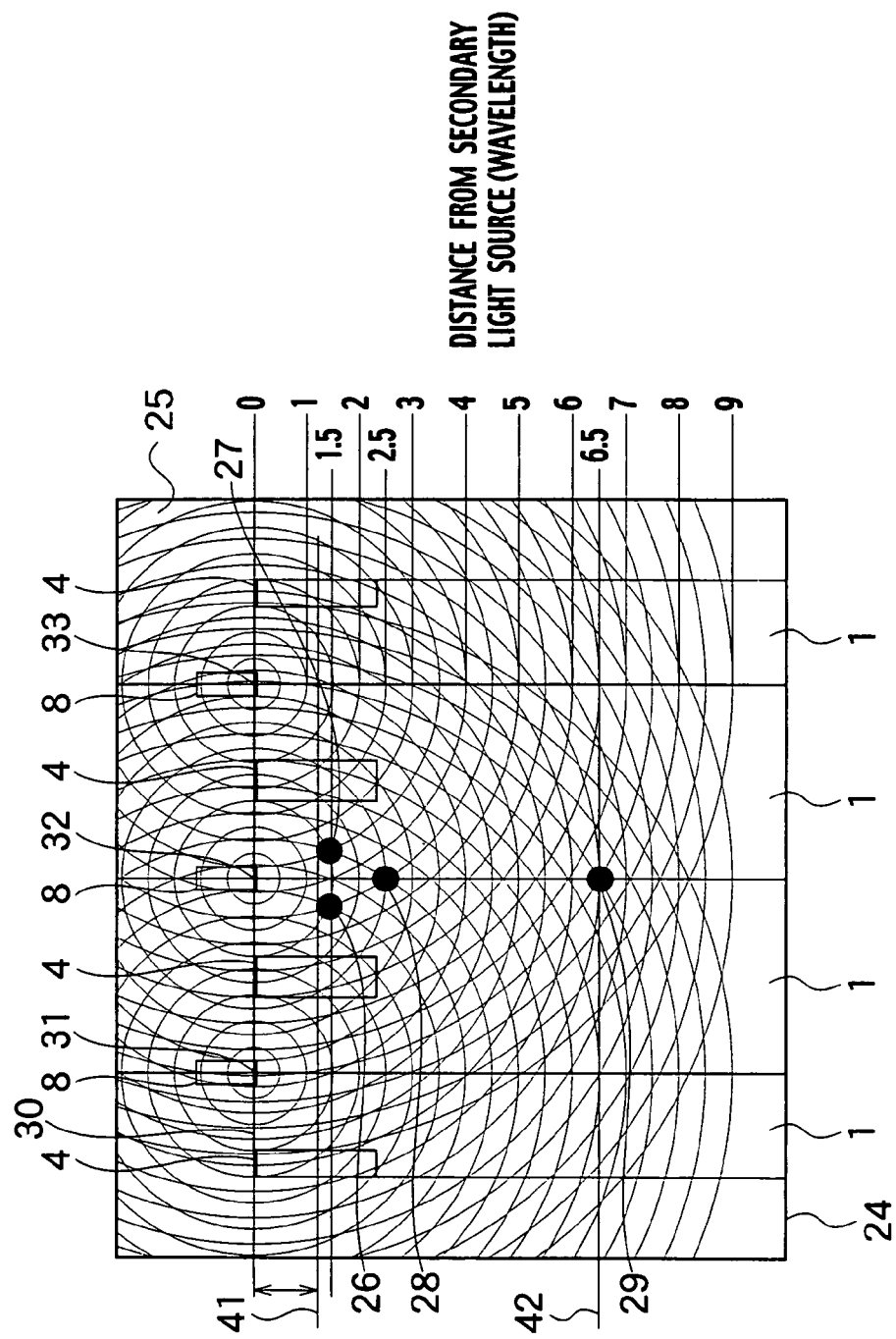
FIG. 11 is a cross section of a semiconductor device showing the arrangement of silicon nitride layers or silicon carbide layers in the semiconductor device according to the second embodiment.

Moreover, as shown in FIG. 11 and as in FIG. 7, the silicon carbide layers or silicon nitride layers 35 and 36 are deployed at locations where the hot spots 26 through 29 are generated. In other words, upper sides 41 of the silicon carbide layers or silicon nitride layers 35 and 36 are arranged closer to the surface of the silicon substrate 1 than the hot spots 26 and 27. Undersides 42 of the silicon carbide layers or silicon nitride layers 35 and 36 are arranged further from the silicon substrate 1 surface than the hot spot 29. Since the refractive index changes by changing the material at the positions where the hotspots 26 through 29 are generated from silicon to silicon carbide or silicon nitride, the hotspots 26 through 29 are not formed.

The hotspots 26 and 27 are at a distance of 1.5 wavelengths from the second order light source 32, the hotspot 28 is at a distance of 2.5 wavelengths, and the hotspot 29 is at a distance of 6.5 wavelengths. Specifically, the depth of the hotspots 26 and 27, from the surface of the silicon substrate 1 is approximately 150 nm if the wavelength of the second order light source 32 is visible light of 400 nm. The depth of the hotspot 28 from the surface of the silicon substrate 1 is approximately 250 nm if the wavelength of the second order light source 32 is visible light of 400 nm. The depth of the hotspot 29 from the surface of the silicon substrate 1 is approximately 650 nm if the wavelength of the second order light source 32 is visible light of 400 nm. Accordingly, it is preferable that the upper sides 41 of the silicon carbide layers or silicon nitride layers 35 and 36 are shallower than approximately 150 nm from the surface of the silicon substrate 1. Otherwise, it is preferred that the upper sides 41 are shallower than approximately 250 nm. It is preferred that the undersides 42 of the silicon carbide layers or silicon nitride layers 35 and 36 are deeper than approximately 650 nm from the surface of the silicon substrate 1. Otherwise, the undersides 42 of the silicon carbide layers or silicon nitride layers 35 and 36 are preferred to be deeper than approximately 250 nm from the surface of the silicon substrate 1.

In the case where carbon has been doped into the silicon substrate 1, carbon is also doped in the isolation regions 37 through 39 so as to provide light absorbency for the flash lamp light 18, so as to improve uniform heating of the silicon substrate 1. The silicon carbide layers 35 and 36 improve the thermal stress tolerance of the silicon substrate 1. Providing of sufficient energy becomes possible without the stress associated with hotspot generation damaging the silicon substrate 1. Through sufficient impurity activation, a low sheet resistance and improvement in uniformity are achieved.

When using the silicon nitride layers 35 and 36, the isolation regions 37 through 39 do not absorb the light 18, which is different from the silicon carbide layers, thereby decreasing the amount of light absorption of the hotspots and changing the refractive index. As a result, generation and intensity of the hotspots may be controlled. In addition, the silicon nitride layers 35 and 36 improve the thermal stress tolerance of the silicon substrate 1.

Note that with the second embodiment, the silicon carbide layers or silicon nitride layers 35 and 36 are formed after formation of the isolation regions 4 through 6 of FIG. 9B. However, the present invention is not limited hereto, and the layers 35 and 36 are formed any time as long as it is before irradiation of the xenon light 18. However, in order for the isolation regions 4 through 6 to absorb light and avoid driving force deterioration for the transistors in the devices, the silicon carbide layers or silicon nitride layers 35 and 36 should be formed after formation of the isolation regions 4 through 6 and before formation of the source/drain regions 14 and 15, preferably before formation of the gate insulating films 7.

By doping an impurity such as carbon or nitride in the silicon substrate 1 ahead of time, heat treatment using a high intensity light source may be performed without damaging the silicon substrate 1. This is due to the hardened silicon carbide layers or silicon nitride layers 35 and 36 being formed in the silicon substrate 1 by doping the impurity in the silicon substrate 1 and again conducting crystallization. Tolerance of heat generation due to thermal stress from irradiation of the high-intensity light energy is improved. Furthermore, by reducing light absorption at locations where hotspots are generated, heat generation may be prevented, and substrate damages may be controlled. Such procedures broaden the process window and provide a more stable process. As a result, an instantaneous heat treatment with strong light intensity is possible without damaging in the silicon substrate 1. Furthermore, high-performance MOS transistors may be fabricated since miniaturization of the semiconductor device is easier.

According to the second embodiment, a semiconductor device fabrication method capable of forming a shallow pn junction without generating slips and/or defects in the semiconductor substrate may be provided.

(Third Embodiment)

A semiconductor device according to a third embodiment is described taking CMOS transistors, which form an LSI semiconductor device, as an example.

Figure 12:
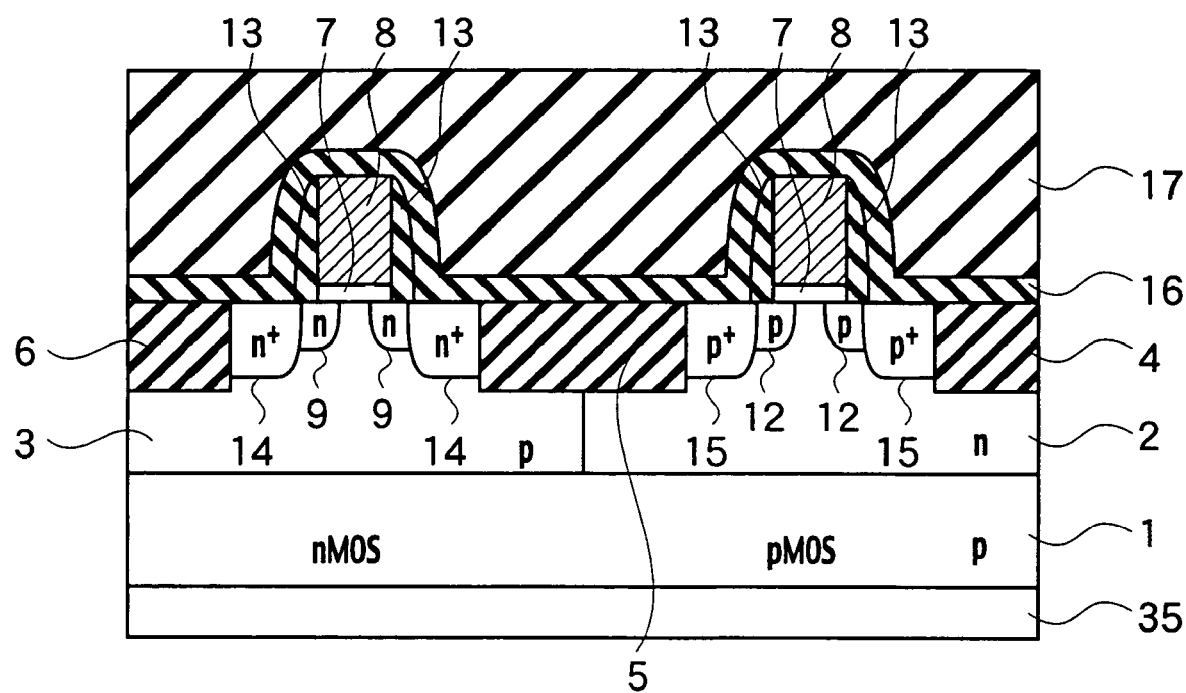
FIG. 12 is a cross section of a semiconductor device according to a third embodiment.

As shown in FIG. 12, the semiconductor device according to the third embodiment has the silicon carbide layer or silicon nitride layer 35 deployed in a different position from that in the semiconductor device of the second embodiment in FIG. 8. The silicon carbide layer or silicon nitride layer 35 is provided on the underside of the silicon substrate 1.

A fabrication method for a semiconductor device according to the third embodiment is described taking as an example, fabrication steps of CMOS transistors, which form an LSI semiconductor device.

Figure 13A:
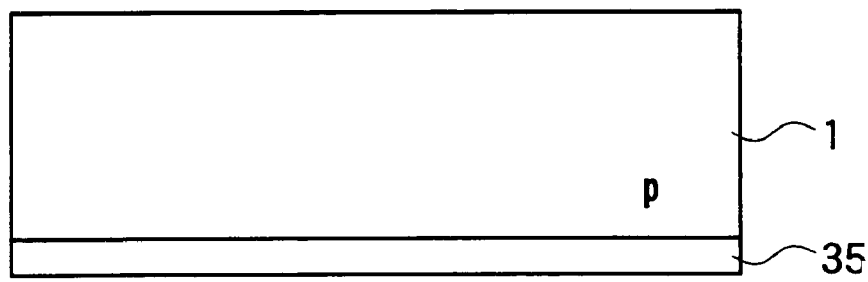
FIGS. 13A through 13C are cross sections of the semiconductor device according to the third embodiment in the course of fabrication.

To begin with, as shown in FIG. 13A, the silicon carbide layer or silicon nitride layer 35 is formed on the underside of the silicon substrate 1 through plasma CVD. The thickness of the silicon carbide layer or silicon nitride layer 35 is set to 1 μm. Note that the silicon carbide layer or silicon nitride layer 35 may be formed by doping carbon atoms or nitrogen atoms in the silicon substrate 1 from the underside thereof. By exchanging the surface and the underside of the silicon substrate 1, implantation of the carbon atoms or nitrogen atoms may be implemented in the same way as with the semiconductor device fabrication method of the second embodiment in FIG. 9B.

Figure 13B:
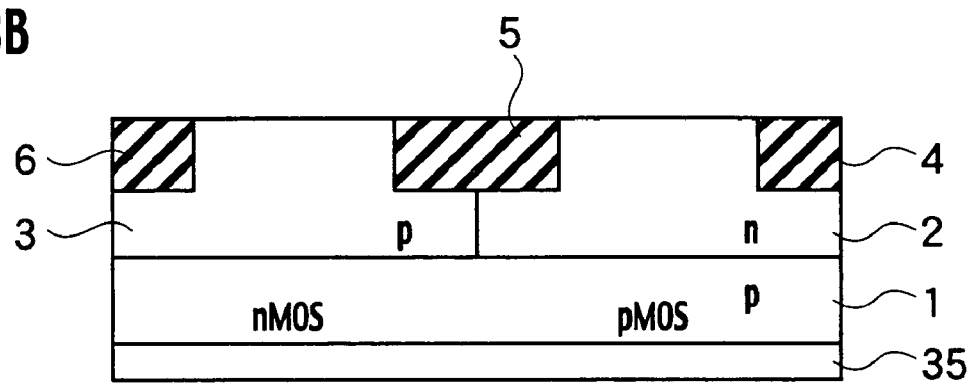

As shown in FIG. 13B, the p-well layer 3 is formed in the nMOS region of the p-type silicon substrate 1, and the n-well layer 2 is formed in the pMOS region. Isolation regions 4 and 6 are formed around the p-well layer 3 and the n-well layer 2, respectively.

Figure 13C:
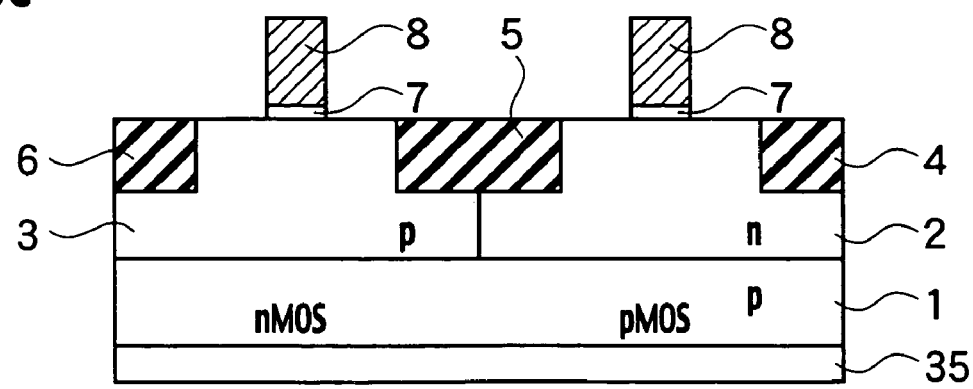

As shown in FIG. 13C, the gate insulator films 7 and the gate electrodes 8 are formed. Formation of the gate insulator films 7 and the gate electrodes 8 may be implemented in the same way as with the semiconductor device fabrication method of the first embodiment in FIG. 1B and that of the second embodiment in FIG. 9C. The remaining steps are implemented in the same way as with the semiconductor device fabrication method of the second embodiment in FIGS. 9d through 9I. The semiconductor device of the third embodiment may then be completed. Note that the conditions for irradiation of the flash lamp 18 have been modified as follows.

Figure 14:
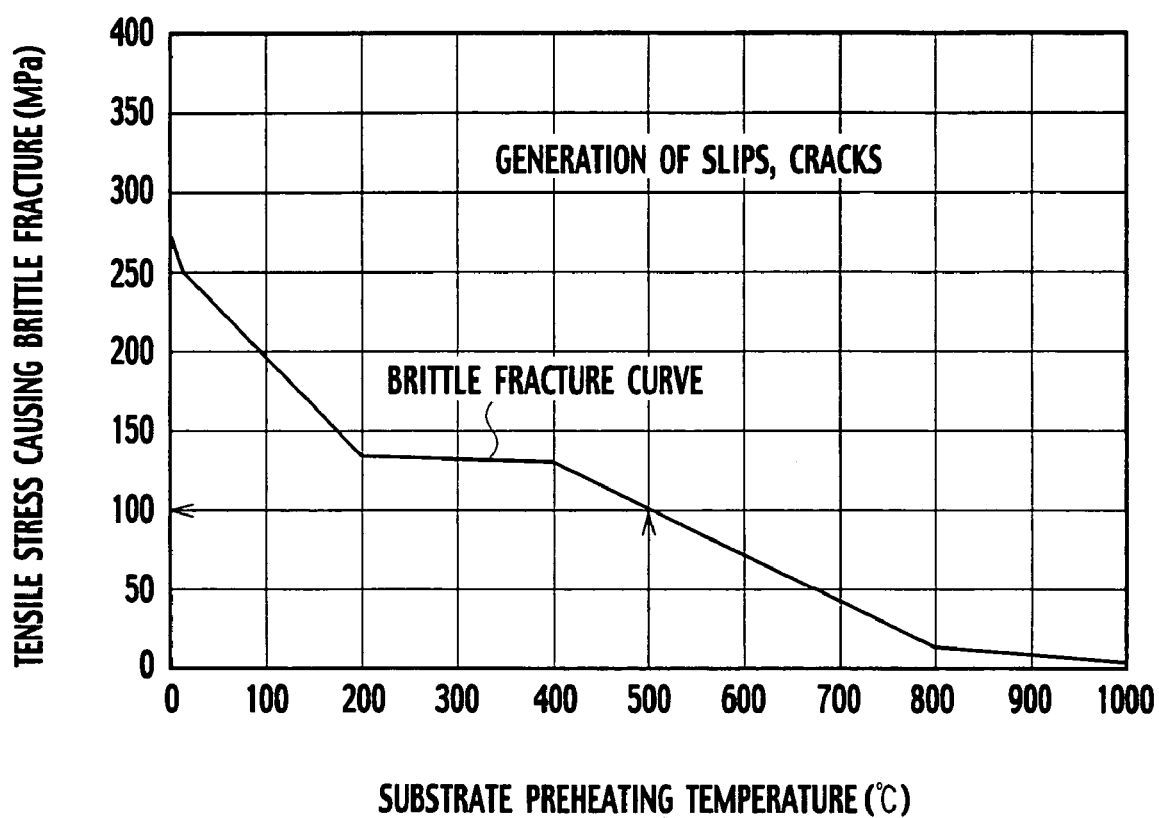
FIG. 14 is a graph representing a relationship between substrate preheating temperature and tensile stress causing brittle fracture of a semiconductor substrate under which flash lamp annealing is carried out using a xenon flash lamp for activation after ion implantation to source and drain diffusion layers employing a semiconductor device fabrication method according to a comparative example.

As shown in FIG. 14, at the substrate preheating temperature of 450° C. of the first and the second embodiment, slips and/or cracks are generated in the conventional silicon substrate 1 wafer when the tensile stress exceeds 120 Mpa. Therefore, the substrate preheating temperature is set to 500° C. at which more cracks are easily generated. At the substrate preheating temperature of 500° C., slips and/or cracks are generated in the conventional silicon substrate wafer when the tensile stress exceeds 100 Mpa.

Figure 15:
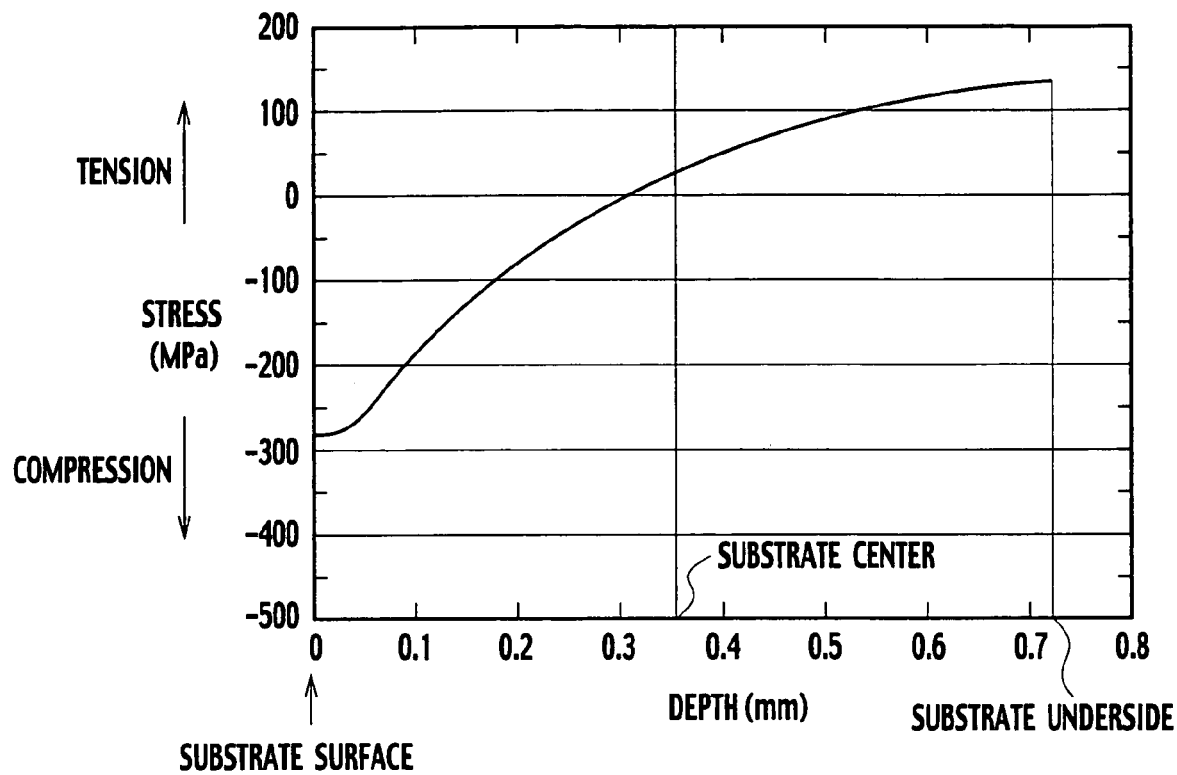
FIG. 15 is a profile of stress versus depth of a semiconductor substrate; wherein that stress is generated through flash lamp annealing using a xenon flash lamp for activation after ion implantation to source and drain diffusion layers employing the semiconductor device fabrication method according to the comparative example.
Figure 16:
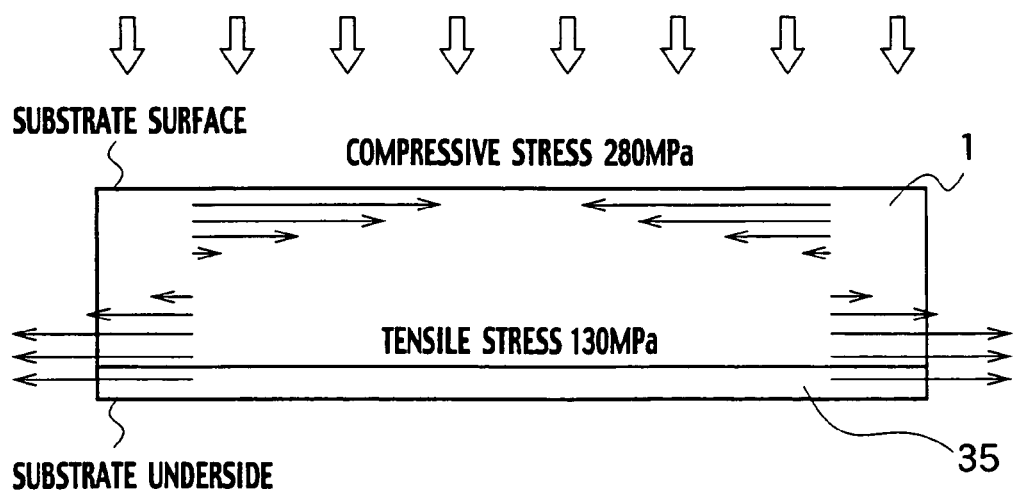
FIG. 16 is a cross section of a semiconductor device showing the generated status of stress during flash lamp annealing using a xenon flash lamp for activation after ion implantation to source and drain diffusion layers employing a semiconductor device fabrication method according to the third embodiment.

In addition, the irradiation time of the flash lamp 18 is set to 3 ms and the irradiation energy density is set to 35 J/cm². As shown in FIGS. 15 and 16, the post-irradiation tensile stress becomes a maximum at the underside of the silicon substrate 1, reaching 130 Mpa. However, slips and/or cracks were not generated in the silicon substrate 1 wafer. In other words, a processing condition 23 may be obtained within the process window 43 of FIG. 10. Note that it is preferable that the silicon carbide layer or silicon nitride layer 35 is provided on or near the underside of the silicon substrate 1. Accordingly, the silicon substrate 1 underside location is at a position where the post-irradiation tensile stress is maximized, which is where the silicon carbide layer or silicon nitride layer 35 may be deployed. The silicon carbide layer or silicon nitride layer 35 may be provided between the surface and the underside of the silicon substrate 1 closer to the underside. This is because tensile stress is generated at this location, which is between the surface and the underside of the silicon substrate 1 closer to the underside. Since the tensile stress generated on the underside emanates from the compressive stress at the surface, deploying the silicon carbide layer or silicon nitride layer 35 near the surface as with the semiconductor device of the second embodiment in order to control an increase in the compressive stress is effective in preventing generation of slips.

According to the third embodiment, a semiconductor device fabrication method capable of forming a shallow pn junction in a semiconductor device without generating slips and/or defects in the semiconductor substrate may be provided.

Note that with the above-mentioned first through the third embodiment, an annealing device using a xenon flash lamp as a light source for an irradiating light has been described. However, the present invention is not limited thereto, and a light source capable of high intensity emission such as a laser beam may be used. In addition, the embodiments of the present invention can be modified and implemented in various ways as long as not deviating from the summary of the present invention.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A method of manufacturing a semiconductor device comprising:
   forming a plurality of isolation regions in a silicon substrate;
   forming a gate insulator film on the silicon substrate;
   depositing gate electrodes on the gate insulator film;

implanting selectively in the silicon substrate with first impurity ions;

annealing to recover crystallographic quality of the implanted silicon substrate suppressing diffusion of the first impurity ions;

depositing an interlayer insulator film on the isolation regions, the silicon substrate, and the gate electrodes; and heating the silicon substrate by irradiating a light having a wavelength such that the light is absorbed by the silicon substrate without being absorbed by the interlayer insulator film, to the silicon substrate via the interlayer insulator film, activating the first impurity ions so as to form source and drain regions.

2. The method of claim 1, further comprising:

implanting selectively in the silicon substrate with second impurity ions before implanting the first impurity ions;

annealing to recover crystallographic quality of the second-impurity-ions-implanted silicon substrate suppressing diffusion of the second impurity ions; and forming a sidewall spacer on a side of the gate electrodes.

3. The method of claim 1, wherein the interlayer insulator film is a porous film formed on the isolation regions, the silicon substrate, and the gate electrodes.

4. The method of claim 1, wherein depositing the interlayer insulator film includes depositing the interlayer insulator film in a recess between the gate electrodes.

5. A method of manufacturing a semiconductor device comprising:

forming an auxiliary layer, which is at least one of a silicon carbide layer and a silicon nitride layer, in a silicon substrate;

forming a plurality of isolation regions on the silicon substrate;

forming a gate insulator film on the silicon substrate;

depositing a gate electrode on the gate insulator film;

implanting selectively in the silicon substrate with first impurity ions; and heating the silicon substrate by irradiating the silicon substrate with a light having a wavelength such that the light is absorbed by the silicon substrate, to the silicon substrate, activating the first impurity ions so as to form source and drain regions above the auxiliary layer.

6. The method of claim 5, further comprising:

implanting selectively in the silicon substrate with second impurity ions before implanting the first impurity ions; and forming a sidewall spacer on a side of the gate electrode.

7. The method of claim 6, further comprising:

annealing to recover crystallographic quality of second-impurity-ions-implanted silicon substrate suppressing diffusion of the second impurity ions.

8. The method of claim 6, further comprising:

heating the silicon substrate by irradiating the light onto the silicon substrate via an interlayer insulator film so as to activate the second impurity ions.

9. The method of claim 5, wherein the auxiliary layer is formed so that the distance from the underside of the gate insulator film to the upper side of the auxiliary layer is shorter than 1.5 times of a wavelength of the light at the silicon substrate.

10. The method of claim 5, wherein forming the auxiliary layer includes implanting auxiliary atoms at least carbon and nitrogen into the silicon substrate through ion implantation, and heating the silicon substrate so as to covalent bond the auxiliary atoms with silicon atoms of the silicon substrate.

11. The method of claim 10, wherein the auxiliary atoms are implanted into the silicon substrate from the surface.

12. The method of claim 10, wherein the auxiliary atoms are implanted into the silicon substrate from the underside.

13. The method of claim 5, wherein the auxiliary layer is formed on the underside of the silicon substrate.

* * * * *